United States Patent
Kim et al.

(10) Patent No.: US 9,519,036 B2
(45) Date of Patent: Dec. 13, 2016

(54) MAGNETIC SENSOR INCLUDING MAGNETIC LAYER OF CLOSED LOOP SHAPE

(75) Inventors: CheolGi Kim, Daejeon (KR); Dong Young Kim, Andong-si (KR); Jong-Ryul Jeong, Daejeon (KR); Quang Hung Tran, Daejeon (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 893 days.

(21) Appl. No.: 12/913,433

(22) Filed: Oct. 27, 2010

(65) Prior Publication Data
US 2011/0175605 A1    Jul. 21, 2011

(30) Foreign Application Priority Data
Jan. 21, 2010 (KR) .................. 10-2010-0005657

(51) Int. Cl.
*G01R 33/06* (2006.01)
*G01R 33/09* (2006.01)
*G01R 33/07* (2006.01)

(52) U.S. Cl.
CPC ............ *G01R 33/06* (2013.01); *G01R 33/07* (2013.01); *G01R 33/09* (2013.01)

(58) Field of Classification Search
CPC .. G01D 5/2266; G01D 5/2275; G01D 5/2283; G01D 5/145; G01D 5/204; G01D 5/2046; G01D 5/2053; G01D 5/206; G01D 5/22; G01D 5/2208; G01D 5/2216; G01D 5/2225; G01D 5/2233; G01D 5/2241; G01D 5/225; G01D 5/2258; G01D 5/14; G01D 5/142; G01D 5/147; G01D 5/16; G01D 5/20; G01D 5/2006; G01D 5/2013; G01D 5/202; G01D 5/2026; G01D 5/2033; G01B 7/02; G01B 7/023; G01B 7/04; G01B 7/046; G01B 7/14; H01L 43/00; H01L 43/06; H01L 43/08; H01L 43/065; G01R 33/0094; G01R 15/202; G01R 15/205; G01R 33/06; G01R 33/09; G01R 33/091; G01R 33/093; G01R 33/095; G01R 33/096; G01R 33/098; G01R 15/20; G01R 33/07; G01R 33/072; G01R 33/075; G01R 33/077
(Continued)

(56) References Cited

U.S. PATENT DOCUMENTS

| 4,441,072 A | 4/1984 | Rahman |
| 4,533,572 A | 8/1985 | Neelameggham et al. |

(Continued)

FOREIGN PATENT DOCUMENTS

| WO | 0157506 A1 | 8/2001 |
| WO | 2006010014 A1 | 1/2006 |

OTHER PUBLICATIONS

Hung et al., Hybrid planar Hall-magnetoresistance sensor based on tilted cross-junction, Journal of Physics D, vol. 42, Feb. 17, 2009.*
(Continued)

*Primary Examiner* — David M. Schindler
(74) *Attorney, Agent, or Firm* — Lucas & Mercanti, LLP

(57) ABSTRACT

Provided is a magnetic sensor for detecting a magnetic field. The magnetic sensor includes a magnetic layer of a closed loop shape; a pair of current terminals which face each other contacting with the closed loop and through which current is input/output; and a pair of voltage terminals which face each other contacting with the closed loop and from which output voltage is detected. Both an anisotropic magnetoresistance
(Continued)

effect (AME) and a planar Hall effect (PHE) contribute to the output voltage and a hysteresis of the output voltage is eliminated by exchange coupling of a ferromagnetic layer by a ferromagnetic-antiferromagnetic layer structure and a ferromagnetic-metal-antiferromagnetic layer structure. Accordingly, it is possible to minimize a hysteresis due to a demagnetization factor of the closed loop, stabilize the output voltage of the magnetic sensor and enhance sensitivity.

13 Claims, 12 Drawing Sheets

(58) Field of Classification Search
USPC .................................................. 324/251, 252
See application file for complete search history.

(56) References Cited

U.S. PATENT DOCUMENTS

| 4,569,742 | A | 2/1986 | Schuetz |
|---|---|---|---|
| 4,681,812 | A | 7/1987 | Schuetz |
| 4,847,584 | A | 7/1989 | Pant |
| 6,529,144 | B1 | 3/2003 | Nilsen et al. |
| 2003/0049869 | A1* | 3/2003 | Prinz .................... G01N 27/745 436/526 |

OTHER PUBLICATIONS

Hung et al., Optimization of the Multilayer Structures for a High Field-Sensitivity Biochip Sensor Based on the Planar Hall Effect, IEEE Transactions on Magnetics, vol. 45, No. 10, Oct. 2009.*
Adeyeye et al., Planar Hall effect and magnetoresistance in Co/Cu multilayer films, Sensors and Actuators A:, vol. 116, May 6, 2004.*
Hung et al., Spin-valve planar Hall sensor for single bead detection, Sensors and Actuators A: Physical, vol. 157, Dec. 4, 2009.*
Chui et al., Detection of a single magnetic dot using a Planar Hall sensor, Journal of Magnetism and Magnetic Materials, 2007, pp. e992-e993.*
Rahm et al., Planar Hall sensors for micro-Hall magnetometry, Journal of Applied Physics, vol. 91, No. 10, May 15, 2002, pp. 7980-7982.*

* cited by examiner

MAGNETIC SENSOR INCLUDING MAGNETIC LAYER OF CLOSED LOOP SHAPE

CROSS-REFERENCE TO RELATED APPLICATIONS

This application claims priority under 35 U.S.C. §119 to Korean Patent Application No. 10-2010-0005657, filed on Jan. 21, 2010, in the Korean Intellectual Property Office, the disclosure of which is incorporated herein by reference in its entirety.

TECHNICAL FIELD

The following disclosure relates to a magnetic sensor, and in particular, to a magnetic sensor that detects broadband direct current (DC) and alternating current (AC) magnetic fields with ultra-high sensitivity using both characteristics of anisotropic magnetoresistance and planar Hall effects.

BACKGROUND

Magneto resistance means electrical resistance or electrical resistivity which changes when a magnetic field is applied to a magnetic substance. Such magnetic resistance is classified into anisotropic magnetoresistance, giant magnetoresistance, tunneling magnetoresistance and colossal magnetoresistance, which all show differences in the theory and principle. A low-power micro magnetic field sensor can be produced by using a film of magnetic substance of nano thickness as the magnetoresistance material, because the characteristic of magnetoresistance is maintained even in a nano size shape. Also, not only it is possible to detect a ultra low magnetic field as the output can be converted into a voltage signal using the characteristic of electrical resistance which changes in accordance with the strength of the magnetic field but also it can be applied as a direct current (DC) and an alternating current (AC) broadband magnetic field sensor as the AC frequency characteristic is superior because it uses resistance change. Accordingly, magnetoresistance phenomenon is used for the head of a hard disk, magnetic field sensor, biosensor, compass, angle sensor, low frequency eddy current sensor for non-destructive inspection and high speed magnetoresistance RAM, etc.

The degree of change in resistance ($\Delta R$) which occurs in accordance with change in the strength of magnetic field of magnetoresistance material is called magnetoresistance ratio (MR [%]) and is expressed in percentage as MR (%)=$\Delta R$/R×100.

Anisotropic magnetoresistance (AMR) is a phenomenon which appears in a single magnetic layer. It has a characteristic of depending on the angle between the directions of current and magnetization and has a magnetoresistance ratio of about 2~5% at ambient temperature. Therefore, the AMR phenomena can be separated two different effects such as anisotropic magnetoresistance effect (AME) and planar Hall effect (PHE), which are defined by the measurement geometry.

Giant magnetoresistance which has a structure of ferromagnet-metal-ferromagnet shows a characteristic of being dependant on the angle between the directions of magnetization of two ferromagnetic layers and independent on the direction of the current. That is, the resistance in the current changes due to spin scattering which depends on the directions of magnetization of the two ferromagnetic layers. The resistance is smallest when the magnetization directions of the two ferromagnetic layers are parallel with each other and is largest when the magnetization directions of the two ferromagnetic layers are antiparallel. In case of such giant magnetoresistance, the magnetoresistance ratio is about 10~50%.

Tunneling magnetoresistance which has a structure of ferromagnet-insulator-ferromagnet also shows a characteristic of being dependant on the angle between the directions of magnetization of two ferromagnetic layers and irrelevant to the direction of the current. That is to say, the resistance in the current which flows tunneling through the insulator between the two ferromagnetic layers changes due to spin scattering which depends on the directions of magnetization of the two ferromagnetic layers. The resistance is smallest when the magnetization directions of the two ferromagnetic layers are parallel with each other and is largest when the magnetization directions of the two ferromagnetic layers are antiparallel. In case of such tunneling magnetoresistance, material with magnetoresistance ratio higher than 500% has been already developed and magnetoresistance of 1000% or higher is expected.

In case a magnetic sensor is used as a magnetoresistance material, the output signal is proportional to the magnetoresistance ratio. Accordingly, in order to enhance the sensitivity by increasing the output signal characteristic which depends on the strength of the magnetic field, the magnetoresistance ratio should be large and linearity of the output signal for the strength of the magnetic field should be secured. However, in case of giant magnetoresistance material or tunneling magnetoresistance material, though it has a strong point of increasing the output signal because the magnetoresistance ratio is large, it has a weak point of having a bad linearity in the zero magnetic field range.

Accordingly, utilizing their superior signal characteristics, giant magnetoresistance material and tunneling magnetoresistance material are used for heads detecting hard disk signals or magnetoresistance RAMs for which no linearity is required. However, in case giant magnetoresistance material or tunneling magnetoresistance material is used as a magnetoresistance sensor, it has weaknesses that the structure of the magnetic sensor becomes complicated as the offset voltage of output signal should be removed while the specified magnetic field is applied because the area where linearity is secured is distributed across the predetermined magnetic field area and that the sensitivity is degraded due to the additional devices.

In the meantime, in case of anisotropic magnetoresistance material, though its magnetoresistance ratio is smaller than that of giant magnetoresistance material or tunneling magnetoresistance material, it has a superior linearity of output signal for the strength of magnetic field in the zero magnetic field range. Also, direction of current can be adjusted by changing the geometry structure of the magnetic sensor based on the principle of anisotropic magnetoresistance characteristic that the characteristic of output signal depends on the angle between directions of the current and magnetization and, accordingly, sensitivity which is a reference for measurement of magnetic field can be improved in principle by enhancing the characteristic of output signal of magnetic sensor through change in the geometry structure and improvement of characteristics of magnetoresistance ratio of the material.

Magnetic sensors which detect magnetic fields using such principle of anisotropic magnetoresistance phenomena are generally classified into anisotropic magnetoresistance effect (AME) sensors and planar Hall effect (PHE) sensors. In the AME sensor, the magnetoresistance itself changed by the magnetic field is measured as the directions of measuring the voltage and of the current are parallel with each other. In the PHE sensor, the direction of measuring the voltage and the direction of the current are perpendicular with each other.

U.S. Pat. No. 4,441,072, U.S. Pat. No. 4,533,572, U.S. Pat. No. 4,569,742, U.S. Pat. No. 4,681,812 U.S. Pat. No. 4,847,584 or U.S. Pat. No. 6,529,144 provide an anisotropic magnetoresistance sensor. WO2006/010014 provides an integrated magnetoresistive speed and direction sensor and WO 2001/57506 provides a magnetic sensor for a bio-sensor using a circular magnetic moment. However, the conventional magnetic sensor only provides a magnetic sensor only using either anisotropic magnetoresistance effect or a planar Hall effect.

A magnetic sensor which only uses either anisotropic magnetoresistance or planar Hall effect is using a single ferromagnetic layer. When a strong magnetic field is applied to such a magnetic sensor, it may cause reversal of output signal due to hysteretic behavior of magnetization. In order to supplement such a characteristic, a driving device is added which applies a strong magnetic field to the magnetic film layer when driving the sensor initially in order to stabilize the output signal by aligning magnetic domains in one direction.

Also, the range of magnetic field which can be measured is limited to the strength of anisotropy field of the magnetic layer when using a single ferromagnetic layer. For example, when NiFe film is used, the measurement range is limited to the range of magnetic field of about 5 Oe. Therefore, measurement of minute magnetic field changing under a magnetic field exceeding the predetermined strength (in case of NiFe, H>5 Oe) is impossible. Thus, in case an anisotropic magnetoresistance effect sensor made of a single layer of NiFe is used for a mobile phone to measure the earth magnetic field for the compass, it will be impossible to make the measurement of earth magnetic field because of the magnetic field of 5-10 Oe inside the equipment generated within the internal circuit and electronic components of the mobile phone.

The characteristic of signal of anisotropic magnetoresistance effect sensor is decreased if the resistance of the sensor is reduced. That is, there is a limit in using an anisotropic magnetoresistance effect sensor as a bio-sensor for measurement of micro magnetic beads since it has a weak point that the signal is decreased when the size of the sensor is reduced in order to measure micro-sized magnetic beads. Accordingly, a magnetic sensor which uses planar Hall effect in which output signal does not have anything to do with the size of the sensor is used as a bio-sensor for measurement of micro magnetic bead.

As the anisotropic magnetoresistance or planar Hall effects are dependent upon the directions of current and of magnetic domain, both effects can be adjusted by changing the shape of the magnetic sensor. In case of the magnetic sensor which uses both effects of anisotropic magnetoresistance or planar Hall, the bead detection capability of the bio-sensor used to measure micro magnetic beads can be enhanced since output signal characteristic can be improved. Accordingly, it is produced as a micro size and low-power magnetic sensor and used as the magnetic sensor or compass sensor for mobile phones or electronic apparatus as the range of magnetic field measurement can be adjusted and the characteristic of magnetic hysteresis can be eliminated when exchange coupling is combined with ferromagnetic layer.

SUMMARY

An embodiment of the present invention is directed to providing the magnetic sensor with a novel structure which has both effects of anisotropic magnetoresistance and planar Hall, sensitively measures changes in broadband direct current (DC) and alternating current (AC) magnetic fields, does not have hysteresis characteristic, has superior linearity, easily adjusts the measurement range of its magnetic field and is microminiaturized.

In one general aspect, a magnetic sensor includes: a magnetic layer of a closed loop shape; a pair of current terminals which face each other contacting with the closed loop and through which the current is input/output; and a pair of voltage terminals which face each other contacting with the closed loop and from which the output voltage is detected. Distinctively, the closed loop is a circular closed loop, an oval closed loop or polygonal closed loop and is preferably a circular closed loop.

In this magnetic sensor, the output voltage from the pair of voltage terminals may have both of anisotropic magnetoresistance effect (AME) and planar Hall effect (PHE) of the magnetic layer.

The magnetic layer may include a ferromagnetic film and preferably, a ferromagnetic film combined with exchange coupling.

In detail, the output voltage coming out of the pair of voltage terminals is generated by anisotropic magnetoresistance effect (AME) resulting from the voltage induced in the direction of the current which passes through the magnetic layer of the closed loop shape and planar Hall effect (PHE) induced vertically to the direction of the current. When the magnetic domains are aligned with one direction using the exchange coupling, the direction of current at all the points flowing along around the circular closed loop changes and, accordingly, the angle between the directions of current and of magnetization changes. Aggregation of AME and PHE at all the points in this closed loop is induced as the output voltage. At this time, planar Hall effect is predominant near the output voltage terminal where the directions of current and exchange coupling are parallel with each other and anisotropic magnetoresistance effect is predominant near 45° line from the input current terminal where the directions of current and exchange coupling are perpendicular to each other. Accordingly, the magnetic sensor with the circular closed loop shape is the novel magnetic sensor which has both characteristics of anisotropic magnetoresistance effect (AME) and planar Hall effect (PHE).

In this magnetic sensor, the closed loop may be a circular closed loop. The ratio of the voltages generated by anisotropic magnetoresistance and by planar Hall effects which contribute to the output voltage is adjusted by the ratio (R/W ratio) of radius (R) of the closed loop and the width (W) of the closed loop.

In detail, the resistance of the closed loop may be adjusted by adjusting the ratio of radius of the closed loop and the width of the closed loop (R/W ratio, hereinafter called R/W). The ratio of the voltage generated by anisotropic magnetoresistance effect and the voltage generated by planar Hall effect which contribute to the output voltage is adjusted as, in case R/W is large, anisotropic magnetoresistance characteristic is predominant and, in case R/W is small, planar Hall characteristic is predominant.

R/W which is the ratio of radius of the closed loop and the width of the closed loop is 0.5 or larger and substantially is between 0.5 and 10,000.

Preferably, in this magnetic sensor, a second magnetic layer which is made of the same material as that of the magnetic layer of the closed loop, is concentric with the closed loop and is off a predetermined distance from the closed loop is further formed inside the closed loop, and a third magnetic layer which is made of the same material as that of the magnetic layer of the closed loop and is off a predetermined distance from the closed loop, the pair of the current terminals and the pair of the voltage terminals is further formed outside the closed loop.

The second magnetic layer or the third magnetic layer is to minimize the influence of demagnetization factor resulting from the shape of magnetic layer on the direction of magnetization when R/W of the circular closed loop increases. In detail, when the demagnetization factor for circumferential direction of ferromagnetic film existing in the magnetic layer increases, it may become a reason to cause hysteretic characteristic. It is to stabilize output voltage and enhance sensitivity of the magnetic sensor by placing a magnetic layer same as the closed loop inside or outside the closed loop separately from the closed loop (and a pair of voltage terminals and a pair of current terminals) to minimize the hysteretic characteristic due to demagnetization factor of the closed loop.

The output voltage signal is maximized by the symmetric resistance value as a pair of current terminals facing with each other and a pair of voltage terminals facing with each other contact with the closed loop alternately, and a terminal selected from the pair of current terminals and a terminal selected from the pair of voltage terminals have a symmetric structure of 90° angle.

Each of the current terminals and the voltage terminals is installed to contact with the circumferential surface of the closed loop, which maximizes the output voltage characteristic, and, the sensor has both the characteristics of anisotropic magnetoresistance and planar Hall effects as the current terminals or voltage terminals do not overlap with the magnetic layer which is the closed loop.

The magnetic layer of the closed loop shape has a superior frequency characteristic for AC and DC current as it includes the ferromagnetic film and uses the magnetoresistance characteristic of the ferromagnetic film. Change in magnetization by the frequency may be extended to ferromagnetic resonance frequency as the eddy current characteristic is disregarded because the thickness of ferromagnetic film of the magnetic layer is of an order of nanometer. In addition, the broadband DC and AC magnetic field may be measured. Accordingly, a DC, AC or pulse type current signal may be applied to the current terminals, and broadband DC and AC magnetic field may be detected, of which the frequency reaction characteristic of the direction of magnetization by strength of magnetic field applied to the magnetic layer is possible to microwave band.

As stated above, the magnetic layer with the closed loop shape may include a ferromagnetic film and, preferably, include the ferromagnetic film combined with exchange coupling.

The magnetic layer which includes ferromagnetic film combined with the exchange coupling is a multi-layer film that one or more selected from the group consisting of antiferromagnetic film, insulator film, non-magnetic metal film and the ferromagnetic film are laminated together. In detail, the magnetic layer is a multi-layer film including a ferromagnetic film and an antiferromagnetic film; a multi-layer film including a ferromagnetic film, a metal film and antiferromagnetic film; a multi-layer film including a ferromagnetic film (I), an insulator film and ferromagnetic film (II); or a multi-layer film including a ferromagnetic film (I), a metal film, a ferromagnetic film (II) and antiferromagnetic film.

The magnetic layer includes a ferromagnetic film with superior anisotropic magnetoresistance ratio which characterizes output voltage. In detail, as the anisotropic magnetoresistance ratio of the ferromagnetic film is due to spin-orbit coupling characteristic and spin polarization of the ferromagnetic film, the ferromagnetic film included in the magnetic layer includes a ferromagnetic film with superior spin-orbit coupling and spin polarization characteristics or a half-metal film with 100% spin polarization.

More specifically, the magnetic layer is a magnetic layer with multi-layer structure which has exchange coupling with no hysteretic characteristic of output voltage. In detail, the magnetic layer with exchange coupling includes a laminated structure of ferromagnetic-antiferromagnetic films, a multi-layer structure which induces antiferromagnetic exchange coupling by spin alignment of antiferromagnetic film, a laminated structure of ferromagnetic film-metal film-ferromagnetic film, a multi-layer structure which has synthetic antiferromagnetic coupling by Ruderman-Kittel-Kasuya-Yosida (RKKY) coupling as a ferromagnetic film-metal film-ferromagnetic film and a laminated structure of a ferromagnetic film-insulator film-ferromagnetic substance film, a multi-layer structure which applies exchange coupling to ferromagnetic film such as orange peel coupling caused by the surface roughness of the ferromagnetic substance.

The magnetic layer does not have hysteretic characteristic of output voltage and is a magnetic layer with improved sensitivity. In detail, the sensitivity of the magnetic sensor is improved by having weak exchange coupling between two magnetic layers and using both anisotropic magnetoresistance and planar Hall effects of the two ferromagnetic films through insertion of a metal film between the ferromagnetic films after fixing the ferromagnetic substance to a direction based on the ferromagnetic film-antiferromagnetic film which has strong exchange coupling.

The magnetic layer with exchange coupling may be produced as a micro magnetic sensor because the anisotropic magnetoresistance and planar Hall effects are maintained even in a nano-sized shape.

The magnetic layer of multi-layer structure may further include an under layer which reinforces the contact force with the substrate and helps crystal growth of magnetic layer, and capping layers for anti-oxidation of metallic magnetic layer. For example, the multi-layer film structure of ferromagnet-antiferromagnet with exchange coupling is made by laminating in order a Ta film as the under layer, a NiFe film with magnetoresistance of about 2% as the ferromagnetic film, IrMn film as an antiferromagnetic film to cause antiferromagnetic exchange coupling and a Ta film as the capping film to prevent oxidation.

Hysteretic characteristic may be eliminated by the exchange coupling because the magnetic layer with exchange coupling may be included as the example of Ta—NiFe—IrMn—Ta laminated film. The range of magnetic field to be measured may be controlled by adjusting the strength of exchange coupling which depends on the thickness of ferromagnetic film and the temperature of heat treatment. In addition, the magnetic sensor with superior thermal stability may be provided as, in case of IrMn, the exchange coupling is maintained to the temperature of about 300° C. As another example, Ta—NiFe(1)-Cu—NiFe(2)-IrMn—Ta laminated film provides the magnetic sensor with improved sensitivity in magnetic field measurement due to weak exchange coupling between NiFe(1) and NiFe(2) created by inserting a film of copper (Cu) as a metal, between NiFe(1) and NiFe(2). Ta—NiFe—Cu—IrMn—Ta laminated film provides the magnetic sensor with improved sensitivity in magnetic field measurement due to decoupling between NiFe and MnIr created by inserting a film of copper (Cu) as a metal, between NiFe and MnIr.

Other features and aspects will be apparent from the following detailed description, the drawings, and the claims.

DETAILED DESCRIPTION OF EMBODIMENTS

Figure 1:
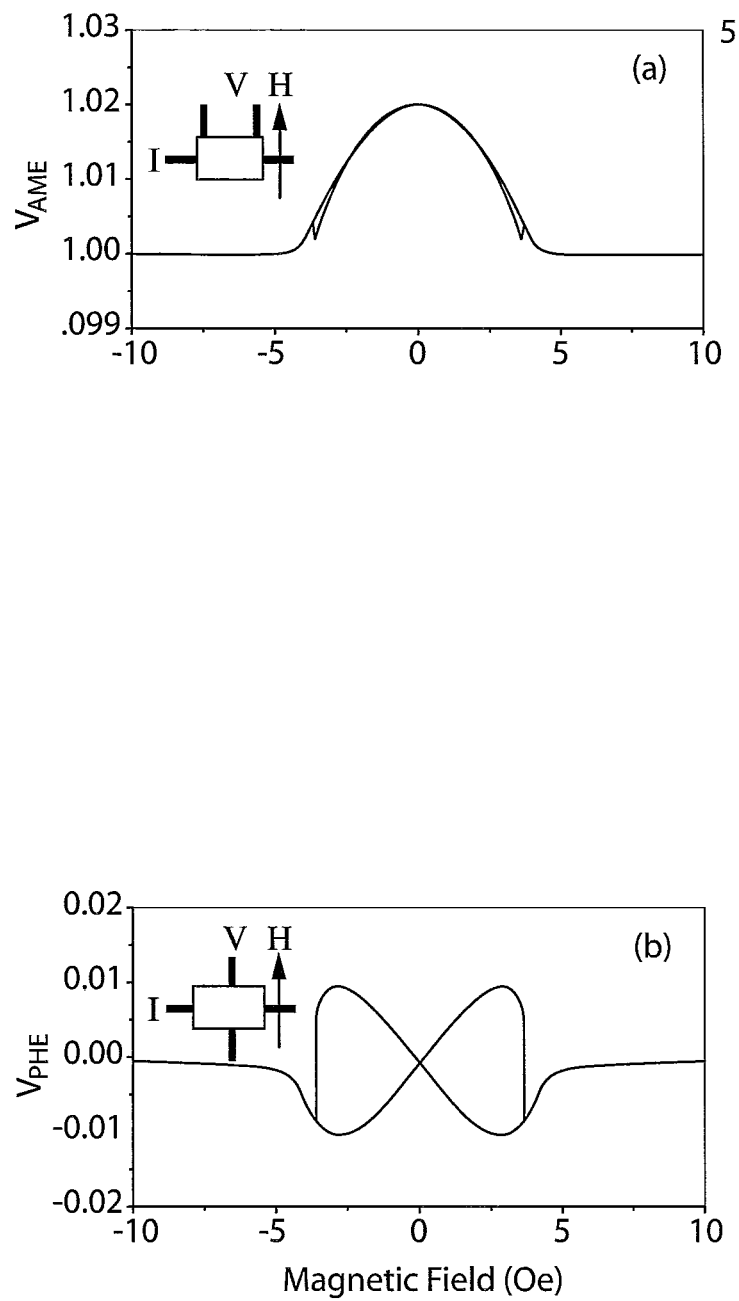
FIG. 1 is a graph showing anisotropic magnetoresistance effect (AME) and planar Hall effect (PHE) of a single ferromagnetic layer having a magnetoresistance ratio of 2% according to an exemplary embodiment.

A magnetic sensor of the present invention will be described in detail with reference to the accompanying drawings, which is set forth hereinafter. The drawings introduced below are provided as examples for sufficiently transferring the concept of the present invention to those skilled in the art. Accordingly, the present invention is not limited to the drawings introduced below and may be specified into other formats. Also, the same reference numbers over the entire specification represent the same constituent elements.

Unless defined otherwise, all terms (including technical and scientific terms) used herein have the same meaning as commonly understood by one of ordinary skill in the art. A detailed description on the known function and configuration that may blur the point of the present invention, is omitted in the following description and accompanying drawings.

Anisotropic Magneto-Resistance (AMR) and Planar Hall Resistance (PHR) Effect of a Single Ferromagnetism Layer Anisotropic magnetoresistance phenomena shows anisotropic characteristic where the resistance changes depending on the angle between current density ($\vec{J}$) direction and magnetization ($\vec{M}$) direction. Such anisotropic magnetoresistance phenomena is due to scattering (s-d scattering) of orbital electrons distorted by the magnetic field and the strength of electric field ($\vec{E}$) which depends on current density and direction of magnetization is expressed in following Equation 1:

$$\vec{E} = \rho_\perp \vec{J} + (\rho_{11} - \rho_\perp)\vec{M}(\vec{J} \cdot \vec{M}) \quad \text{Eq. 1}$$

where $\rho_\perp$ and $\rho_{11}$ are electrical resistivity values when the directions of a magnetic domain and current are perpendicular and parallel respectively. $\vec{M}$ is a vector of magnetic domain and $\vec{J}$ is a vector of a current density.

In Equation 1, change of the magnetoresistance may be measured in a direction in parallel with the current density and a direction perpendicular to the current density. Voltage by resistance change in the direction in parallel with the current density vector is the anisotropic magnetoresistance effect (AME) and voltage by change in resistance in the direction perpendicular to the current density vector is the planar Hall effect (PHE).

In case of a sensor having a straight bar shape, output voltage by the AMR effect (AME) from the Equation 1 is expressed as following Equation 2.

$$V_{AME} = I(\rho_\perp + \Delta\rho\cos^2\theta)\frac{l}{tW} \quad \text{Eq. 2}$$

where I is current and l is a length of a ferromagnetic film. W is a width of a ferromagnetic film, t is a thickness of the ferromagnetic film, and $\Delta\rho = \rho_{11} - \rho_\perp$.

The output voltage by the AME has offset voltage by a resistance value of $\rho_\perp$ and is changed into a format of $\cos^2\theta$ according to an angle $\theta$ between the current direction and the magnetic domain direction. When current is applied to an easy axis of the ferromagnetic substance and a magnetic field is applied perpendicularly to the easy axis, output voltage according to the magnetic field is as shown in FIG. 1(a). That is, the output voltage of AME is shown as a symmetric format on the basis of H=0. The output voltage by the planar Hall effect (PHE) from Equation 1 is expressed as following Equation 3.

$$V_{PHE} = I\frac{\Delta\rho}{t}\sin\theta\cos\theta \quad \text{Eq. 3}$$

The output voltage by PHE has an offset value of 0, and is changed into a $\sin\theta\cos\theta$ format according to an angle $\theta$ between the current direction and the magnetic domain direction. When current is applied to an easy axis of a ferromagnetic substance and a magnetic field is applied in a perpendicular direction to an easy axis, PHE according to the magnetic field is as shown in FIG. 1(b). That is, the output voltage of PHE has a superior linear characteristic near H=0. When the direction of the magnetic field is changed after applying the magnetic field over the saturation magnetic field, a very large hysteretic characteristic is obtained.

Since the AMR phenomena has a magnetoresistance ratio ($\Delta\rho/\rho_\perp$) of 2-5% at ambient temperature, offset of output voltage by $\rho_\perp$ is very large. However, since the output voltage by AME is proportional to a length when the width of the magnetic sensor and the thickness of the magnetic layer are constant, there is an advantage that a size of an output signal may be controlled. On the other hand, since PHE does not depend on the length and width of the magnetic sensor, there is an advantage that the output signal is maintained although the size of the sensor is microminiaturized. In case of the magnetic sensor based on only the AME characteristic, 4 AME sensors configured in a Wheatstone bridge format are used as a magnetic sensor to eliminate offset voltage by $\rho_\perp$ and extract only a signal by $\Delta\rho = \rho_{11} - \rho_\perp$ as the magnetoresistance characteristic. Since the PHE sensor do not have offset voltage, the PHE sensor is used in a bar format as shown in FIG. 1.

Output Characteristic of a Circular Closed Loop Shape

When both AME and PHE characteristics are combined in the magnetic sensor, a sensitivity characteristic of the magnetic field sensor is improved by combining a function of controlling the output signal by the AME characteristic and a function of maintaining the signal characteristic in microminiaturization. Accordingly, a circular closed loop shape has both the AME characteristic and the PHE characteristic. A superior micro magnetic sensor having a sensitivity performance is manufactured by using the function of controlling the output signal characteristic by changing the radius and thickness of the closed loop.

The characteristic of the magnetic sensor of the circular closed loop shape with both the AME and PHE characteristics is analyzed in consideration of the magnetization direction according to strength of the magnetic field and a current direction at each point of the closed loop. The magnetization direction $\phi$ according to the strength of the magnetic field is calculated by a Stoner-Wolfforth (S-W) model. The S-W model for a magnetic layer having unidirectional exchange coupling energy $J_k$ is expressed as energy density $E_{tot}$ as shown in Equation 4.

$$E_{tot} = -MHt\cos(\phi-\phi_H) + tK_u\sin^2\phi + J_k\cos\phi \qquad \text{Eq. 4}$$

In Equation 4, $E_{tot}$ is a total energy density and M is magnetization. H is an external applied magnetic field and $\phi$ is a magnetization angle from the easy axis. $\phi_H$ is an angle of the applied magnetic field from the easy axis and $K_u$ is a uniaxial anisotropy constant of ferromagnetic layer.

A magnetization direction $\phi_{eq}$ in an equilibrium state is obtained under a condition $\partial E_{tot}/\partial \phi = 0$ that 0 is acquired by differentiating a result of Equation 4. When $\phi_{eq}$ as the magnetic domain direction is the same at all locations of the magnetic layer forming a closed loop, i.e., when $\phi_{eq}$ has a single magnetic domain format, AME and PHE signals simply depend on $\phi = \phi_{eq} - \phi_I$ as an angle between the magnetic domain direction $\phi_{eq}$ and the current direction $\phi_I$ flowing in the circular closed loop. That is, when a reference of a horizontal axis is set in $\phi_I = 0$ direction, the current direction flowing in the circular closed loop is changed as $90 \Rightarrow 0 \Rightarrow -90$ in an upper loop and $-90 \Rightarrow 0 \Rightarrow 90$ in a lower loop. Accordingly, the output signal of the closed loop including both AME and PHE characteristics is analyzed as the sum of output voltages generated at each location of the closed loop. Output voltages ($V_{AME}^{1/4}$, $V_{PHE}^{1/4}$) independent to each of AME and PHE with respect to a ¼ loop of the upper closed loop are calculated by Equations 5 and 6 as follows.

$$V_{AME}^{1/4} = \frac{\pi RI}{2tW}(\rho_\perp + \Delta\rho)\int_{90}^{0}\cos^2\theta\,d\phi_I \qquad \text{Eq. 5}$$

$$V_{PHE}^{1/4} = \frac{I\Delta\rho}{t}\int_{90}^{0}\sin\theta\cos\theta\,d\phi_1 \qquad \text{Eq. 6}$$

where R is a radius of a circular closed loop.

The magnetic sensor of the present invention has a shape that 4 magnetic layers shows a bridge format as a symmetric shape that an input end and an output end have a location of a 90° angle. One bridge means the ¼ loop of the upper closed loop. Considering the current direction and the magnetization direction of the magnetic layer with respect to each ¼ loop, output characteristics of loops facing with each other in the upper and lower portions are the same. Accordingly, effects on the AME and PHE characteristics described in Equations 5 and 6 through the output voltage characteristic are analyzed by processing two bridges facing with each other among the 4 bridges with a metal resistance film in order to analyze the characteristic of the facing bridges. A structure of Ta 5 nm/NiFe 50 nm/MnIr 10 nm/Ta 5 nm is used as a magnetic layer for measuring the output voltage characteristic of the facing bridge. The change of the output voltage according to the strength of the magnetic field is measured under the fixed input current of I=1 mA.

Figure 2:
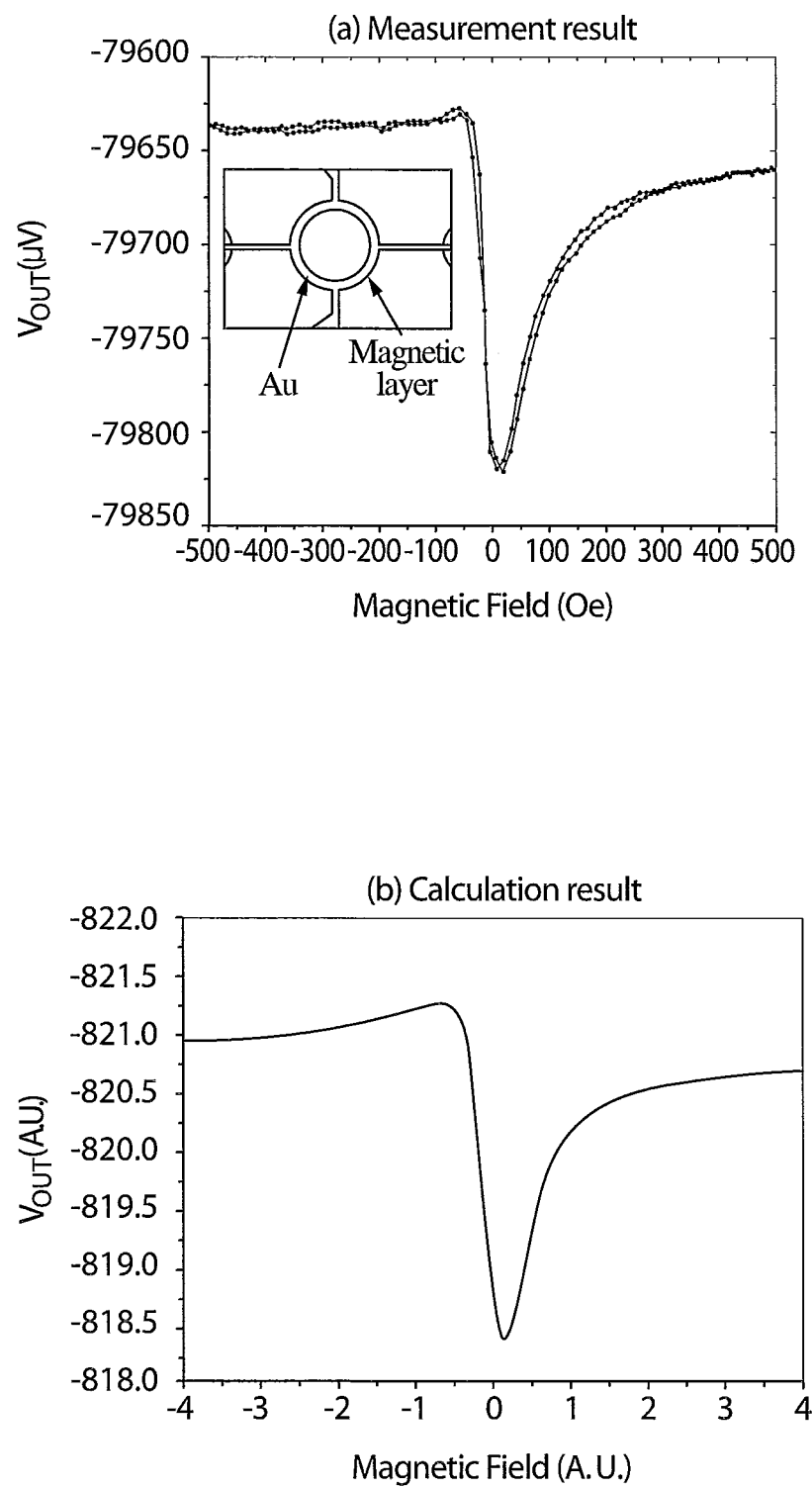
FIG. 2 is a graph showing a measurement result (a) and a calculation result (b) of output voltage characteristics with respect to a pair of facing bridges of a circular closed loop according to an exemplary embodiment.

FIG. 2 is a graph showing a measurement result and a calculation result of an output voltage characteristic with respect to a pair of facing bridges of the circular closed loop. In the calculation result, an output voltage characteristic on a Wheatstone bridge having a structure that a pair of facing bridges are magnetic substances and the other pair of facing bridges are metal resistors in the entire circular closed loop. The resistance characteristic of the magnetic substance applies Equations 5 and 6. In the output voltage of FIG. 2, offset voltage by $\rho_\perp$ among the AME characteristics of Equation 5 is very large and the output voltage according to strength of the magnetic field shows an asymmetric structure according that H=0. A fact that the asymmetric structure is caused by coupling of the AME and PHE characteristics is known through calculation. Output voltage induced from each bridge of the circular closed loop structure is described as the aggregation of the AME and PHE characteristics.

Since the 4 bridges have the symmetric structure, the circular closed loop may be analyzed by the output characteristic of the Wheatstone bridge. That is, the characteristic of the magnetoresistance is changed as much as a phase difference of 180° in a bridge facing with each other by current directions flowing in the upper and lower loops in the circular closed loop formed of the 4 same magnetic substances. Accordingly, the output voltage characteristics of AME and PHE have different directions in the facing bridges. In result, very large offset voltages are canceled out by each other and only the characteristic of the magnetoresistance contributes to output voltage. When the output voltage characteristic is analyzed in the entire circular closed loop, a result that the offset voltage by $\rho_\perp$ disappears and the coupled characteristics of AME and PHE by is obtained as expressed in following Equation 7.

$$V_{out} = \frac{\Delta\rho I}{t}\left(\frac{\pi R}{2W}F_{AME}(H,\phi_I) + F_{PHE}(H,\phi_I)\right) \qquad \text{Eq. 7}$$

where $F_{AME}$ and $F_{PHE}$ are shape factors for AME and PHE that reflect the changes according to the strength of the external magnetic field and the current direction by the shape of the closed loop and show integral values of Equations 5 and 6.

The characteristic of the output voltage of the circular closed loop is measured to analyze characteristics of the shape factors. The magnetic layer adopts a structure of Ta 5 nm/NiFe 50 nm/MnIr 10 nm/Ta 5 nm and the change of the output voltage according to strength of the magnetic field is measured under the fixed input current of I=1 mA.

Figure 3:
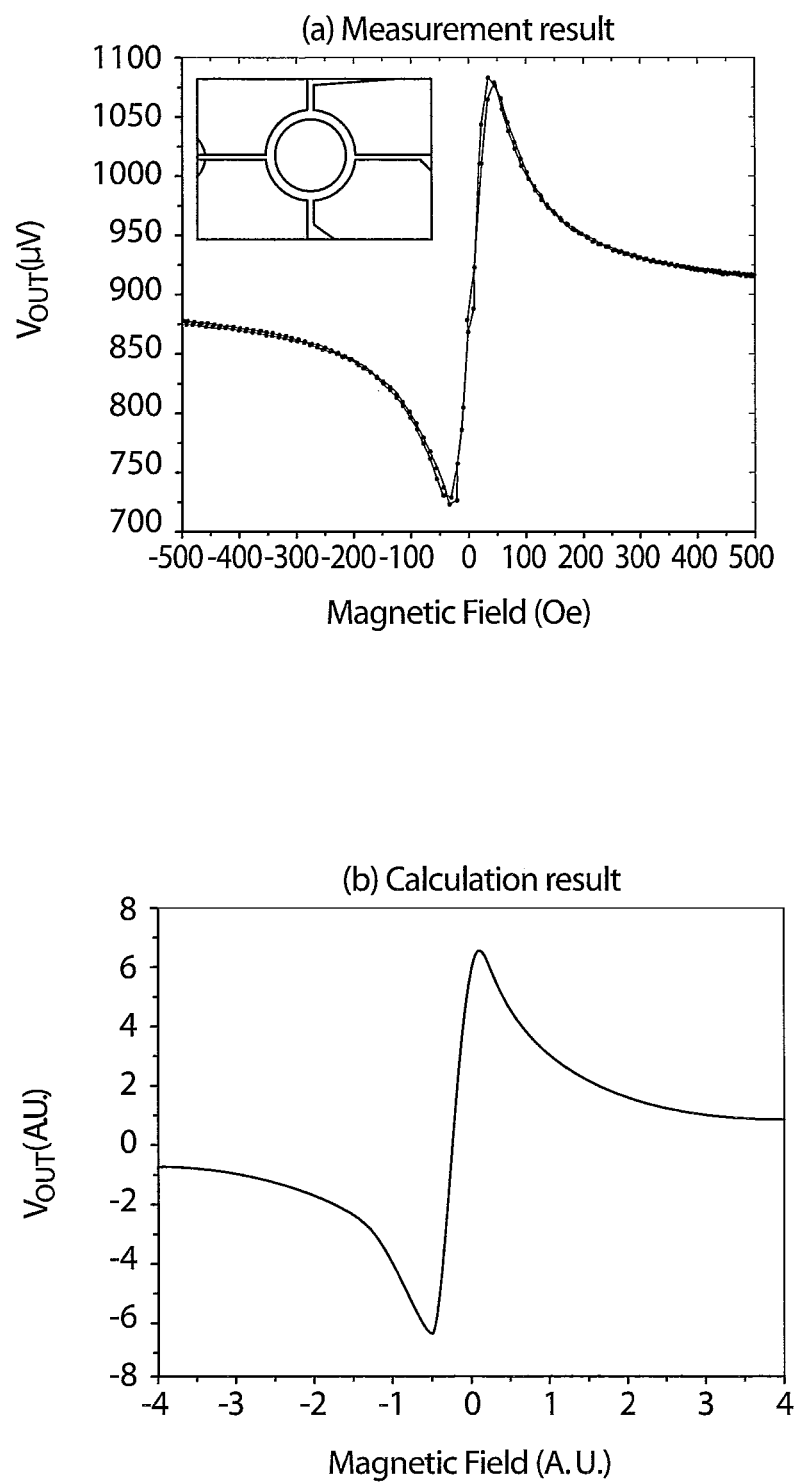
FIG. 3 is a graph showing a measurement result (a) and a calculation result (b) of the output voltage characteristic of the circular closed loop according to an exemplary embodiment.

FIG. 3 is a graph showing a calculation result and a measurement result of the output voltage characteristic of the circular closed loop. In the calculation result, the output voltage characteristic on the Wheatstone bridge that the entire circular closed loop has a magnetic substance structure is analyzed. The resistance characteristic of the magnetic substance applies Equations 5 and 6. In the output voltage of FIG. 3, the offset voltage by $\rho_\perp$ in the AME characteristics of Equation 5 is eliminated. The output voltage according to the strength of the magnetic field shows a superior linearity characteristic near H=0.

Accordingly, there is an advantage that the superior linearity is secured by the characteristic of the output signal having the structure of the circular closed loop shape, which may be adopted in the magnetic sensor. The calculation result shows that the output characteristic of the circular closed loop is caused by both the AME and PHE voltage.

Figure 4:
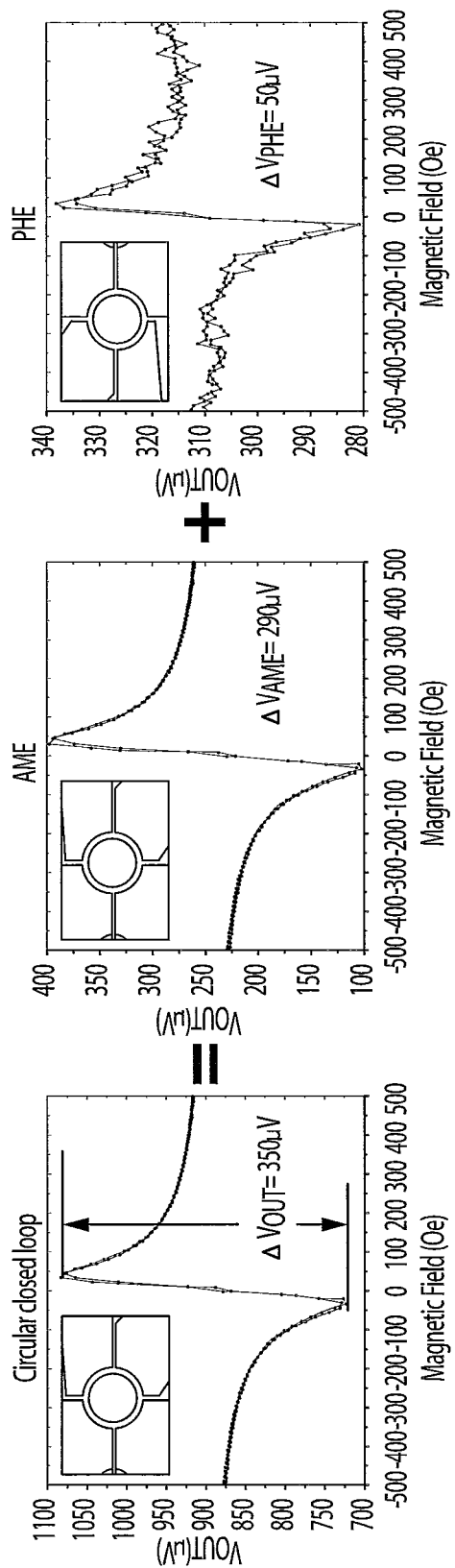
FIG. 4 is a graph showing a measurement result of an output voltage characteristic of the circular closed loop by the AME and PHE according to an exemplary embodiment.

Equation 7 shows that both AME and PHE affect the output voltage of the circular closed loop. FIG. 4 shows a measurement result of an output voltage characteristic of the circular closed loop by the AME and PHE. In the output characteristic of the circular closed loop, the output characteristic by the AME as a magnetoresistance characteristic induced from the bridge ranging from a vicinity of an input current terminal to an output terminal is predominant. In a voltage characteristic induced from the magnetic layer around an output voltage measuring terminal, the PHR characteristic is predominant. In order to analyze the above characteristics, FIG. 4 shows an analysis result that the measurement results on the output characteristics are compared. The magnetic layer adopts a structure of Ta 5 nm/NiFe 50 nm/MnIr 10 nm/Ta 5 nm in order to measure the characteristic of the output voltage of the circular closed loop. The change of the output voltage according to the strength of the magnetic field is measured under the fixed input current of I=1 mA.

A difference $\Delta V_{out}$ between the maximum output voltage and the minimum output voltage according to strength of the magnetic field determines performance of the magnetic sensor of the circular closed loop. In FIG. 4, the circular closed loop shows $\Delta V_{out}$=350 μV. In the closed loop eliminating the magnetic layer near the output terminal meaning the AME, it is shown as $\Delta V_{AMR}$=290 μV. In the closed loop by only the magnetic layer near the output terminal meaning the PHE, it is shown as $\Delta V_{PHR}$=50 μV. The test result shows that the aggregation of the AME and PHE characteristic reflects a performance characteristic of the circular closed loop. Accordingly, the output performance of the circular closed loop according to the applied magnetic field is expressed as following Equation 8.

$$\Delta V_{out} = \Delta V_{AME} + \Delta V_{PHE} \quad \text{Eq. 8}$$

A result of Equation 8 is the result of Equation 7 and performance of the output voltage according to the applied magnetic field is proportional to an anisotropic magnetoresistance characteristics $\Delta\rho$, $F_{AME}$, and $F_{PHE}$ meaning a shape characteristics. Accordingly, the performance of the circular closed loop may be enhanced by using a magnetic layer of a large $\Delta\rho$ and geometrical structure change, since the performance of the circular closed loop depends on $\Delta\rho$, $F_{AME}$ and $F_{PHE}$.

Figure 5:
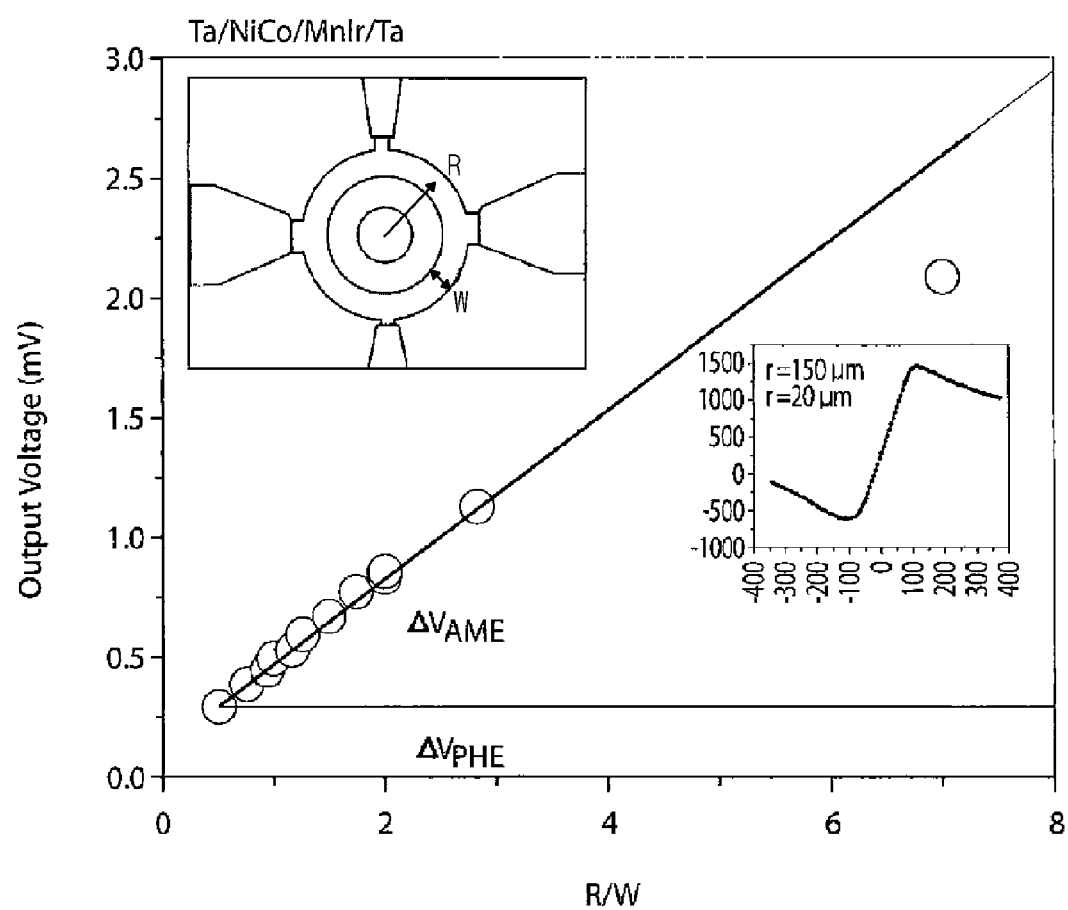
FIG. 5 is a graph showing an output voltage characteristic according to R/W of the circular closed loop according to an exemplary embodiment.

It is confirmed in Equation 8 that the output voltage of the circular closed loop is affected by both AME and PHE. FIG. 5 shows that total output voltage is composed of the AME and PHE and linearly propositional to a ratio (R/W) of a radius (R) and width (W) of the circular closed loop based on Equation 7.

FIG. 5 shows that when a thickness (t) of the current and ferromagnetic layer is constant, the more the R/W increases, the more predominant the AME is in the output performance of the circular closed loop. When the R/W is small, the PHE becomes predominant. According to increase of the R/W, the resistance of the circular closed loop increases and the output characteristic by the AME also increases. Accordingly, when the R/W is large, voltage driving is possible since the output voltage on the Wheatstone bridge is proportional to the input voltage $V_{in}$ as shown in $V_{out}$=$\Delta R V_{in}$/$R_\perp$. Since drive current decreases when the resistance is large, there is an advantage that a low power magnetic sensor may be realized.

When the R/W approaches to 0.5 (R/W→0.5), the output voltage of the circular closed loop is induced from the PHE. Accordingly, when the R/W is small, current driving is possible since the output voltage for PHE is proportional to the input current I ($V_{out}$=$\Delta\rho$I/t).

When the resistance is small, there is a shortcoming that power consumption is large by increase of the driving current. However, since there is a feature that the output voltage is irrelevant to the size of the magnetic sensor, the micro-sized magnetic sensor may be advantageously realized. In addition, when driving by increasing the amount of the current, it is possible to detect micro magnetic beads located on the sensor by using the magnetic field of the sensor itself by the current flowing in the metal magnetic layer included in the sensor. Accordingly, the magnetic sensor with R/W~0.5 may be used as a bio-sensor for measuring magnetic beads. When driving by the AC current, there is an advantage that the magnetic sensor may be applied as a permeability sensor of a ferromagnetic film since the permeability spectrum of a ferromagnetic film is able to be measured.

Figure 6:
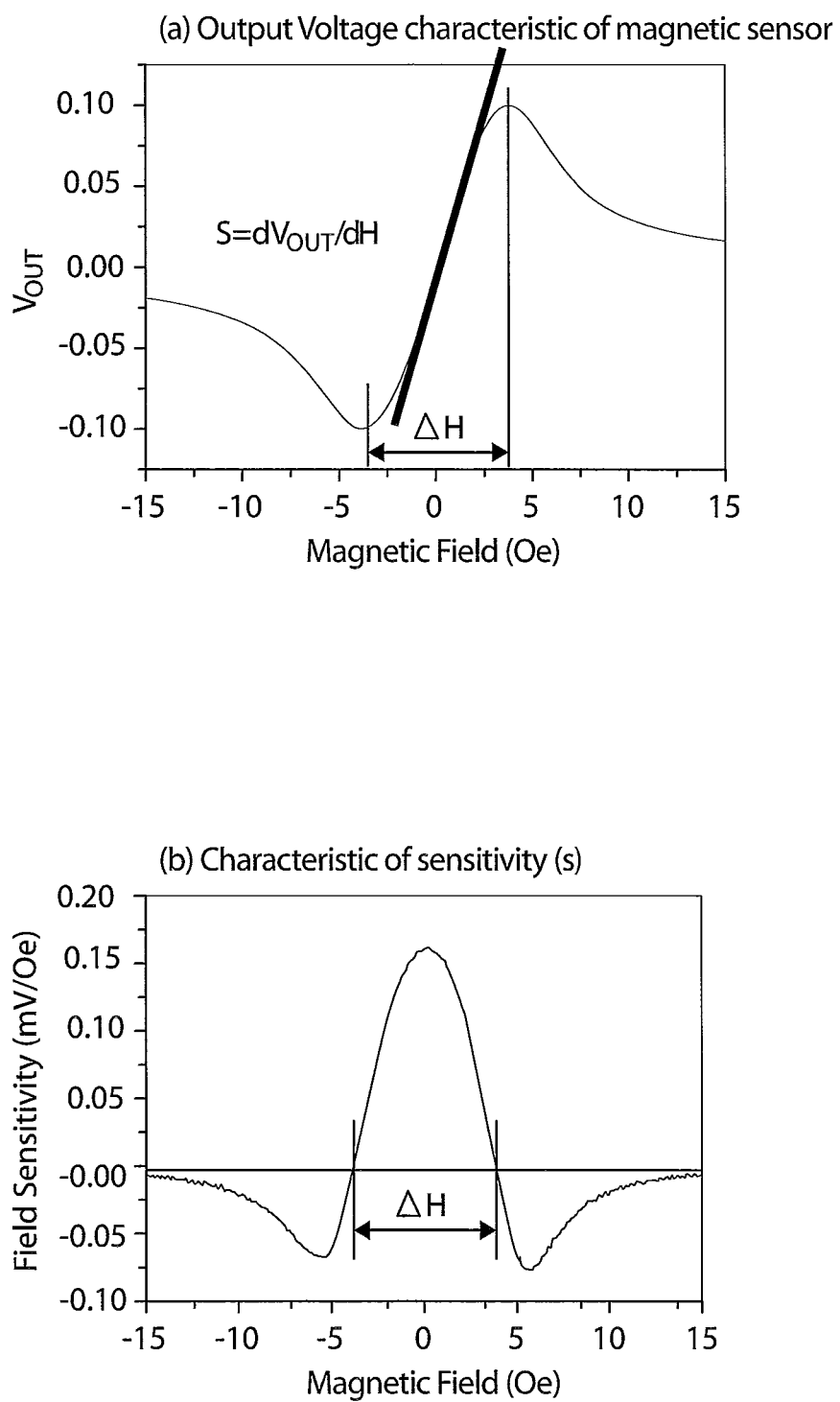
FIG. 6 is a graph showing an output voltage characteristic and a sensitivity (S) characteristic of the magnetic sensor according to an exemplary embodiment.

Analysis of a Magnetic Field Measurement Range and the Sensitivity Characteristic of a Magnetic Sensor It needs to analyze a magnetic field measurement range and a sensitivity characteristic which indicates the performance of the sensor that measures magnetic field when a circular closed loop shape is used with a magnetic sensor. As shown in FIG. 6, after limiting the measurement range of a magnetic field with the output characteristic of the magnetic sensor with applied magnetic field to a magnetic field range (ΔH) where the output characteristic of the sensor becomes at its maximum and minimum, the field sensitivity S may be analyzed from a gradient of the output characteristic according to the field strength. FIG. 6(a) shows the characteristic of ΔH and S, and an S-W model of the Equation 4 and the output characteristic of a magnetic sensor of the Equation 8 may be used in order to analyze those characteristics.

The sensitivity S of the circular closed loop shape magnetic sensor with applied magnetic field may be calculated as following Equation 9.

$$S = \frac{\partial V_{out}}{\partial H} = \frac{\Delta V_{ouy} \cos 2\theta \cos\theta}{H_k \cos 2\theta + H_{ex} \cos\theta + H \sin\theta} \quad \text{Eq. 9}$$

where $H_k$ is the anisotropy field of a ferromagnetic layer, and $H_{ex}$ indicates an exchange bias field in ferromagnetic/antiferromagnetic bilayer. The exchange bias field, $H_{ex}$ is depend on the unidirectional exchange coupling energy $J_k$ in Equation 4, ferromagnet thickness t and the saturation magnetization as bellow Equation 10

$$H_{ex} = \frac{J_k}{tM_s} \quad \text{Eq. 10}$$

FIG. 6(b) shows sensitivity characteristic of the magnetic sensor which is calculated using the Equation 9. The sensitivity depends on the magnetization angle and applied magnetic field. The maximum sensitivity comes at θ=0° from Equation 9, and at H=0 from FIG. 6(b). Thus, the maximum sensitivity of the magnetic sensor is simply expressed as following Equation 11.

$$S_{max} = \frac{\Delta V_{out}}{H_k + H_{ex}} \quad \text{Eq. 11}$$

Based on Equation 11, the maximum sensitivity of an magnetic sensor decreases, as the $H_{ex}$ increases. Accordingly, it needs to minimize the $H_{ex}$ in order to enhance the sensitivity. A magnetic field measurement range may be obtained at a condition of θ=45° from the Equation 9 when it is defined to a range where the sensitivity satisfies S=0. That is, a magnetic field measurement range ΔH is the same as following Equation 12.

$$\Delta H = H_k + H_{ex} \quad \text{Eq. 12}$$

The magnetic field measurement range is proportional to the exchange bias field $H_{ex}$. Accordingly, the magnetic field measurement range of the magnetic sensor may be controlled by controlling the $H_{ex}$. Since the sensitivity and the magnetic field measurement range are in trade off each other according to the exchange bias field $H_{ex}$. The sensitivity and the magnetic field measurement range are essential variables to be considered in case of designing the magnetic sensor based on its applications.

Enhancing of the Hysteresis of the Output Voltage Signal

In case of using a single magnetic layer which has uniaxial anisotropy or biaxial anisotropy as a magnetic sensor, a hysteretic characteristic is appeared at an output voltage profiles with magnetic field. This hysteretic characteristic reduces a performance of the magnetic sensor because it makes a magnetic sensor lose information about a direction of a magnetic field. Accordingly, it is necessary to eliminate the hysteretic characteristic caused by uniaxial, biaxial or shape anisotropies.

CoNiFe alloys which are superior in the anisotropic magnetoresistance materials show a uniaxial anisotropy property. That is, magnetization comes in a stable condition when it has an angle of 0° and 180° along with the easy axis. When one cycle of a high magnetic field is applied to a ferromagnetic layer, the magnetic domain may rotate by 0°-180°-360°. In this case, the output voltage which depends on an angle between the direction of the current and magnetization direction displays a large hysteresis. However, when a ferromagnet/antiferromagnet material with which the magnetization easy axis has unidirectional anisotropy is used and one cycle of a high magnetic field is applied, the hysteresis of an output voltage is eliminated because the magnetic domain rotates by 0°-180°-0°.

Figure 7:
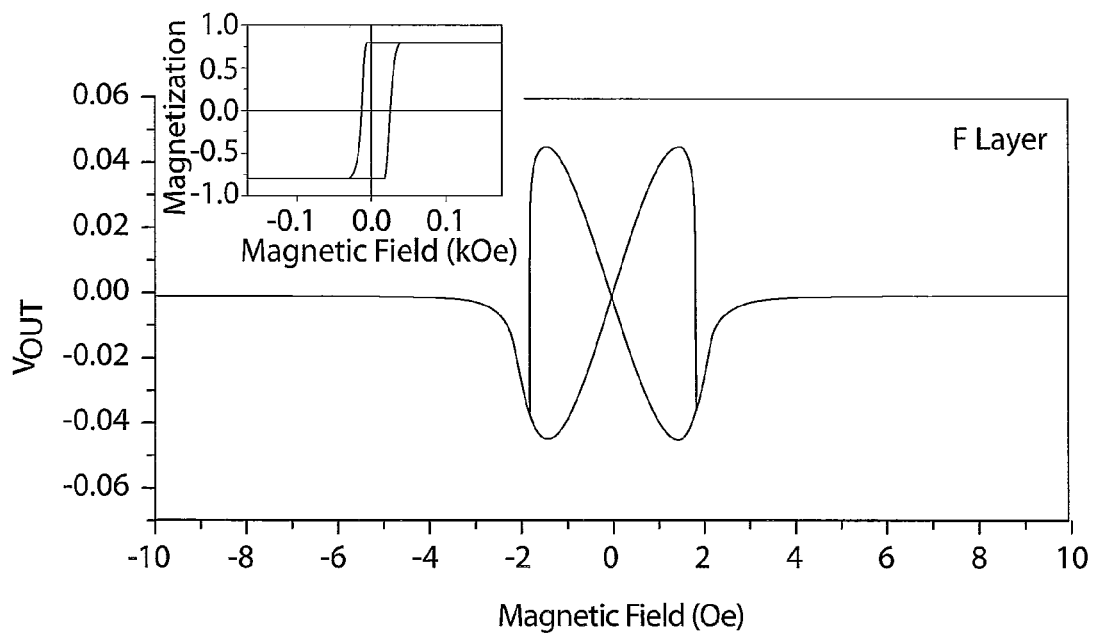
FIG. 7 is a graph showing an output characteristic of the magnetic sensor using a single-layer ferromagnetic substance (F) and a ferromagnetic/antiferromagnetic (F/AF) multi-layer film having exchange coupling according to an exemplary embodiment.
Figure 7:
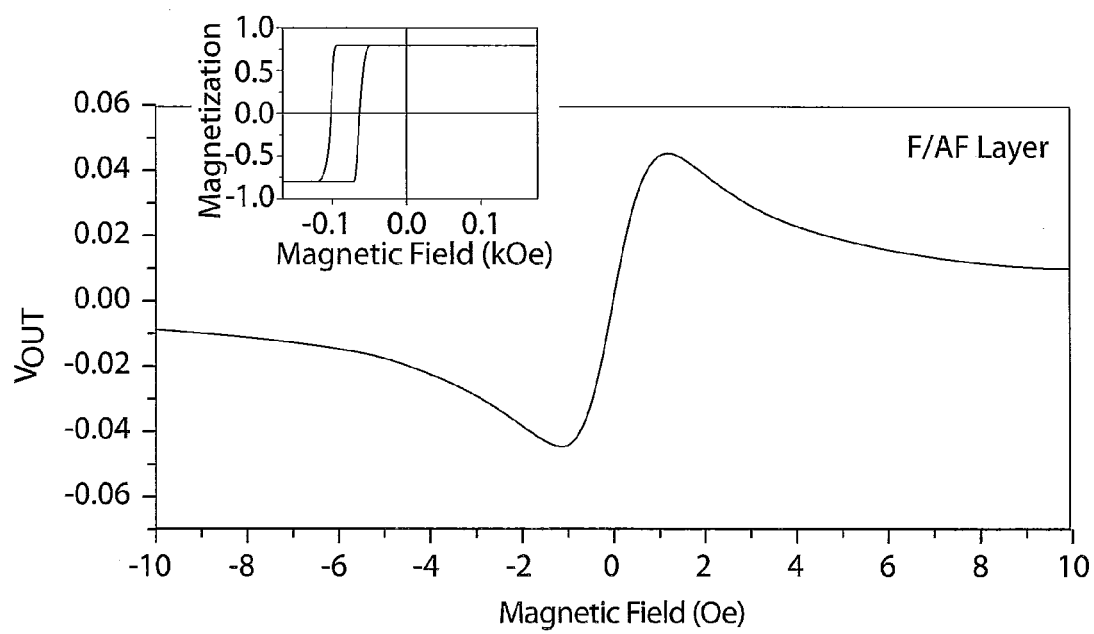

FIG. 7 shows an output characteristic of the magnetic sensor for the single ferromagnetic layer and exchange biased ferromagnetic/antiferromagnetic (F/AF) bilayers. As shown in FIG. 7, the hysteresis of output voltage appears clearly at a single ferromagnetic layer, but the hysteresis of output voltage disappears at exchange biased F/AF bilayers. Accordingly, the hysteresis of output signal may be eliminated when the exchange biased material is used for a magnetic sensor. Accordingly, an exchange coupling energy $J_k$ is adopted for the S-W model of Equation 4 to calculate the output voltage with no hysteresis and estimate the sensitivity of the circular closed loop.

There are several methods for creating the exchange coupling energy including an exchange biasing in F/AF bilayers as described above, an RKKY coupling in ferromagnet/metal/ferromagnet trilayer structure and an orange peel coupling due to surface roughness in ferromagnet/insulator/ferromagnet trilayer structure.

These show an exchange coupling energy $J_k$ at a ferromagnetic layer and play a role of the exchange bias field $H_{ex}$ in the ferromagnetic layer. As shown in the magnetization curve (see the inserted figure) of the F/AF structure in FIG. 7, the magnetization (M) becomes equal to saturation magnetization ($M_s$) near H=0, which is due to the exchange bias field $H_{ex}$. Accordingly, the direction of magnetization, which rotates with the applied magnetic field may be calculated by using single domain model described on Equation 4 because the magnetic domains are aligned to one direction by the exchange bias field, and the output voltage and sensitivity of the circular closed loop may be analyzed based on these results. In addition, the magnetic layer which has a characteristic of an exchange coupling has a merit of enhancing a signal to noise ratio (S/N ratio) because noise generated from creation of the magnetic domain and/or from movement of the magnetic domain decrease in the single domain structure.

The output characteristic of the magnetic sensor is inversely proportional to a thickness of a ferromagnetic layer. Accordingly, the thickness of the ferromagnetic layer should be minimized in order to enhance the output voltage, but in this case, there exists a demerit that the sensitivity of the magnetic sensor decreases because the exchange bias field increases. Therefore, it needs to find a way to minimize the thickness of the ferromagnetic layer while reducing the exchange bias field. In order to meet those characteristics, the magnetic layer of the circular closed loop may be optimized through the decoupling of exchange biased F/AF bilayers by insert the thin metal layer between F and AF layer or RKKY coupling, which effect is smaller than the exchange bias effect.

In order to eliminate the hysteresis of the output voltage for the circular closed loop and enhance the sensitivity, the structure of Ta (5 nm)/NiFe (6 nm)/Cu (2 nm)/NiFe (4 nm)/MnIr (15 nm)/Ta (5 nm) is used for the magnetic layer. A the output voltage with applied magnetic field was measured under fixed input current of I=1 mA and its calculation result based on the S-W model are shown in FIG. 8.

Figure 8:
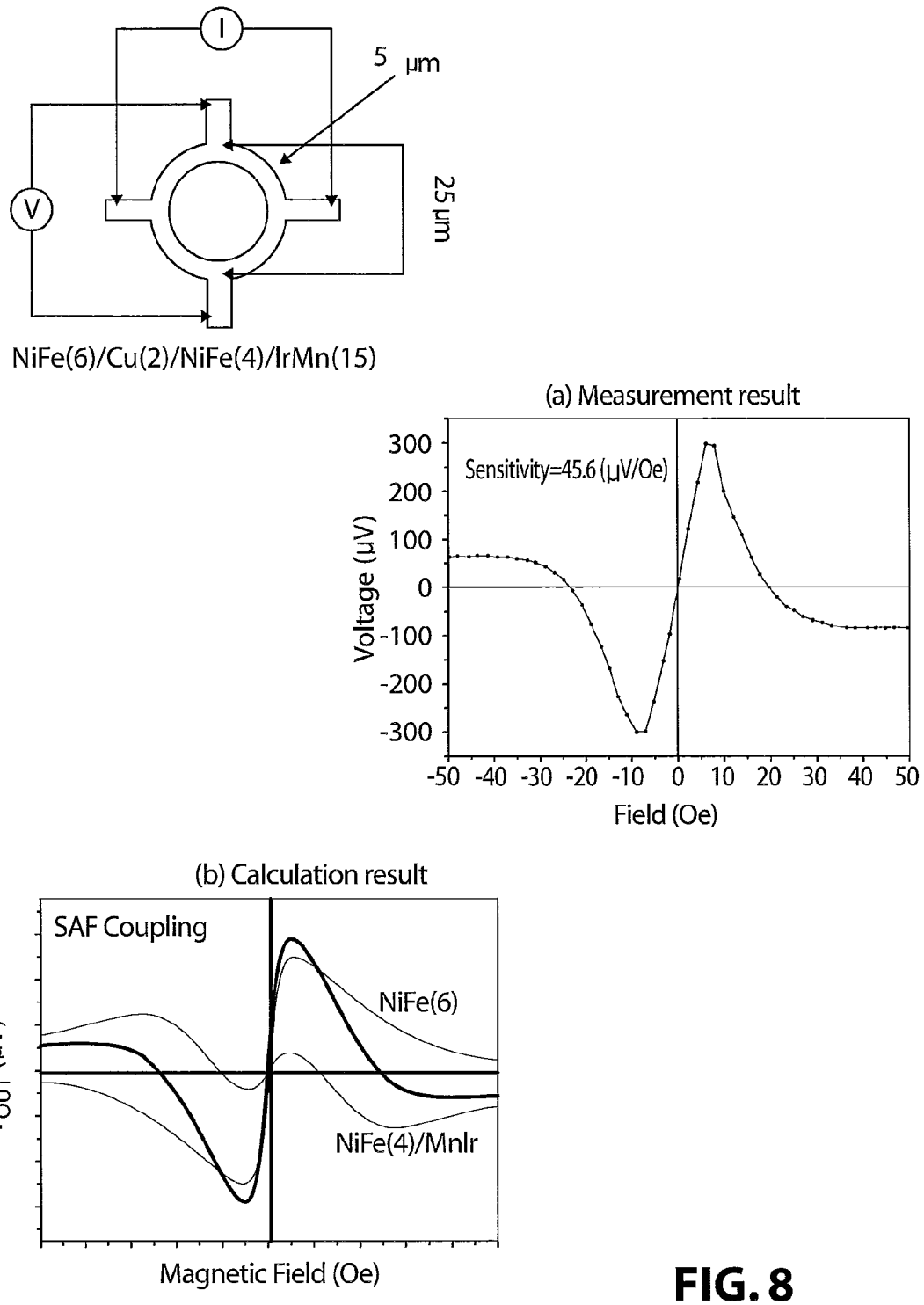
FIG. 8 is a graph showing an output characteristic of the circular closed loop having F/AF and RKKY coupling force according to an exemplary embodiment.

The magnetic layer used in the measurement of FIG. 8 adopts a NiFe/Cu/NiFe structure to grant a weak exchange coupling characteristic while a NiFe/MnIr structure to grant a strong exchange coupling characteristic. The output voltage of the circular closed loop which has both characteristics of the exchange coupling is shown in FIG. 8(a), and the calculation result of the output characteristic for the structures of the magnetic layers are shown in FIG. 8(b). FIG. 8 shows that the results of a measurement well agree with that of a calculation, which considered a weak synthetic antiferromagnetic (SAF) coupling in NiFe/Cu/NiFe layers and strong exchange bias field in NiFe/MnIr layers. Under such coupling conditions, the output voltage may be optimized, and the output voltage of the circular closed loop is indicated as the sum of output characteristics of the two different ferromagnetic layers. There is an advantage that the sensitivity may be more enhanced than in the F/AF structure.

Enhancing of the Shape Anisotropy of the Closed Loop

Figure 9:
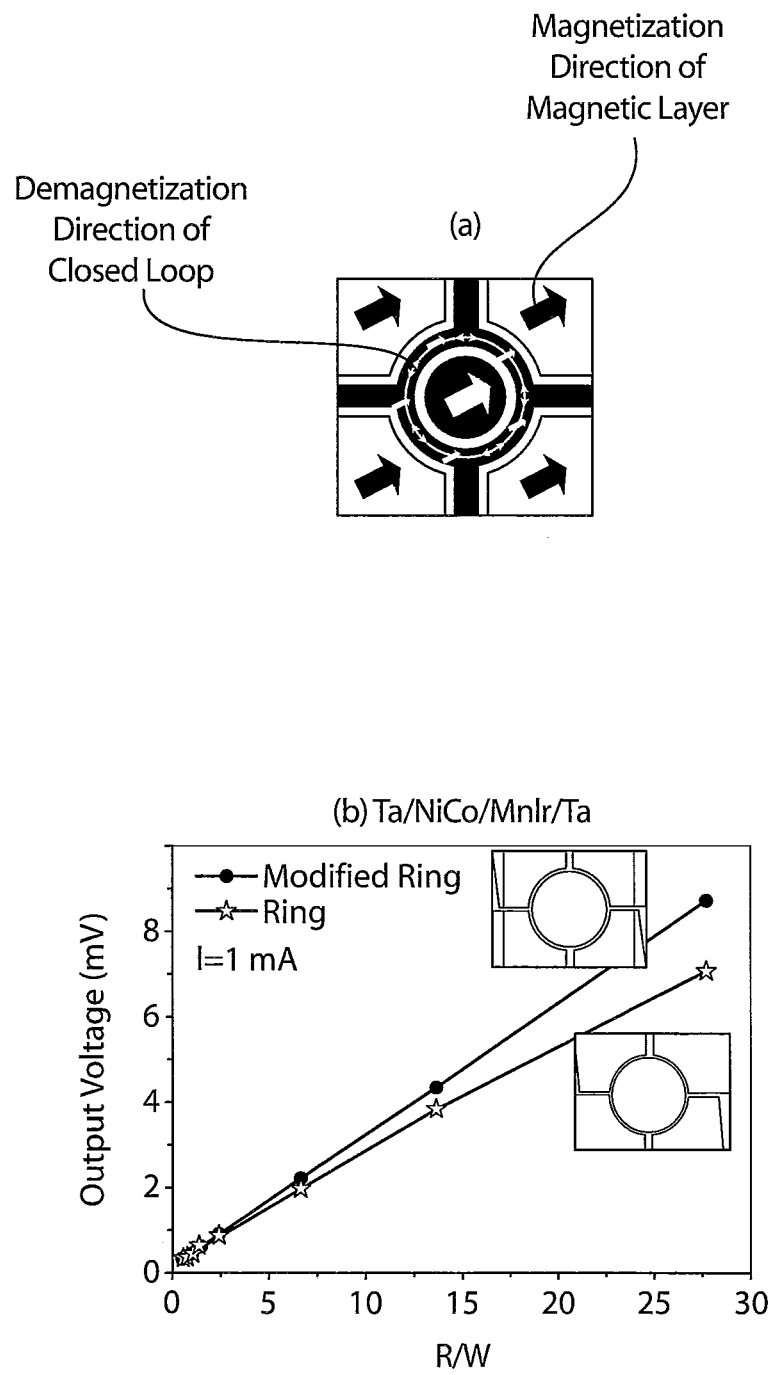
FIG. 9 shows a reducing effect of the shape anisotropic characteristic by an internal or external magnetic layer of the circular closed loop according to an exemplary embodiment.

A shape anisotropy based on geometry is considered in the magnetic sensor of a circular closed loop structure. A shape anisotropy factor i.e., a demagnetization factor, may be neglected when the shape of the magnetic layer is much larger than the thickness of the magnetic layer. However, when the radius (R) of the circular closed loop is too small to be neglected comparing to the thickness of the ferromagnetic layer or when the width of the circular closed loop is so narrow that the R/W is large, a shape anisotropy should be considered. When the R/W is large as shown in FIG. 9, the shape anisotropy factor of a circumferential direction increases. The shape anisotropy factor of the circumferential direction may impact on a magnetization loop with applied magnetic field. That is, when the direction of the shape anisotropy factor changes at each position of the circular closed loop, the magnetization direction changes as well. Such a characteristic reduces the sensitivity of the circular closed loop shaped magnetic sensor and increases the hysteresis of output voltage. Therefore, it needs a method for reducing a shape anisotropy factor of the circular closed loop.

For this, as shown in FIG. 9(a), the magnetic layer same as the closed loop is placed separately from the closed loop inside and/or outside the closed loop. Interaction between a magnetic field which is induced from an internal or external magnetic layer separated from the closed loop and a magnetic layer of the closed loop may reduce the shape anisotropy factors. It means that the closed loop and the magnetic layer inside and/or outside the closed loop are formed to a single magnetic layer like structure and effectively decrease shape anisotropy factors. Therefore, this method has a merit of enhancing the hysteresis and the sensitivity. And it has stabilizing the output voltage by eliminating the magnetic domain of the circular closed loop of a magnetic sensor. The FIG. 9(b) shows the effect of the inside and outside magnetic layer for the enhancement of the output voltage in CoNi/MnIr bilayers.

Embodiments of the Magnetic Sensor

Figure 10:
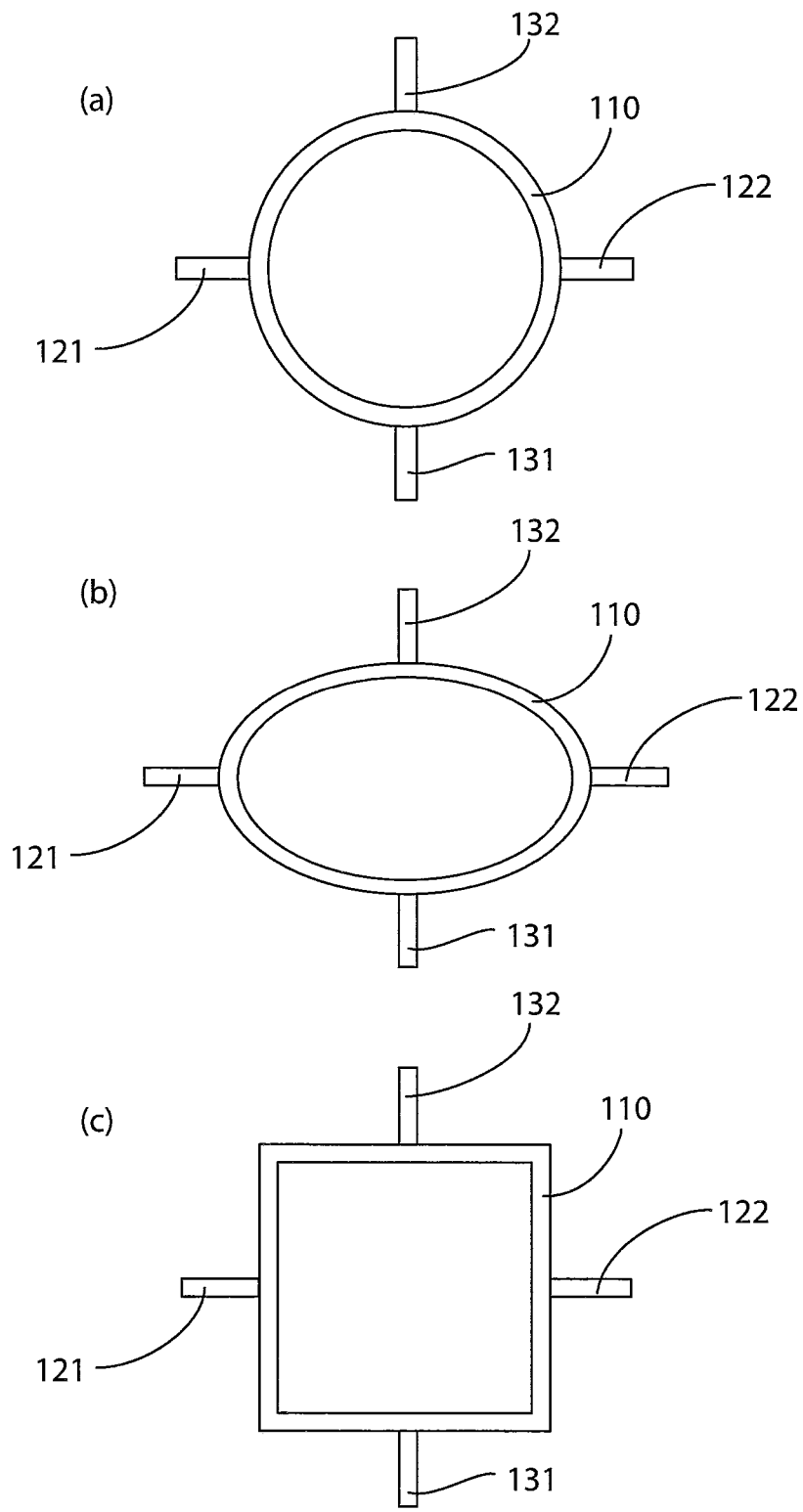
FIG. 10 shows the magnetic sensor according to an exemplary embodiment.
Figure 11:
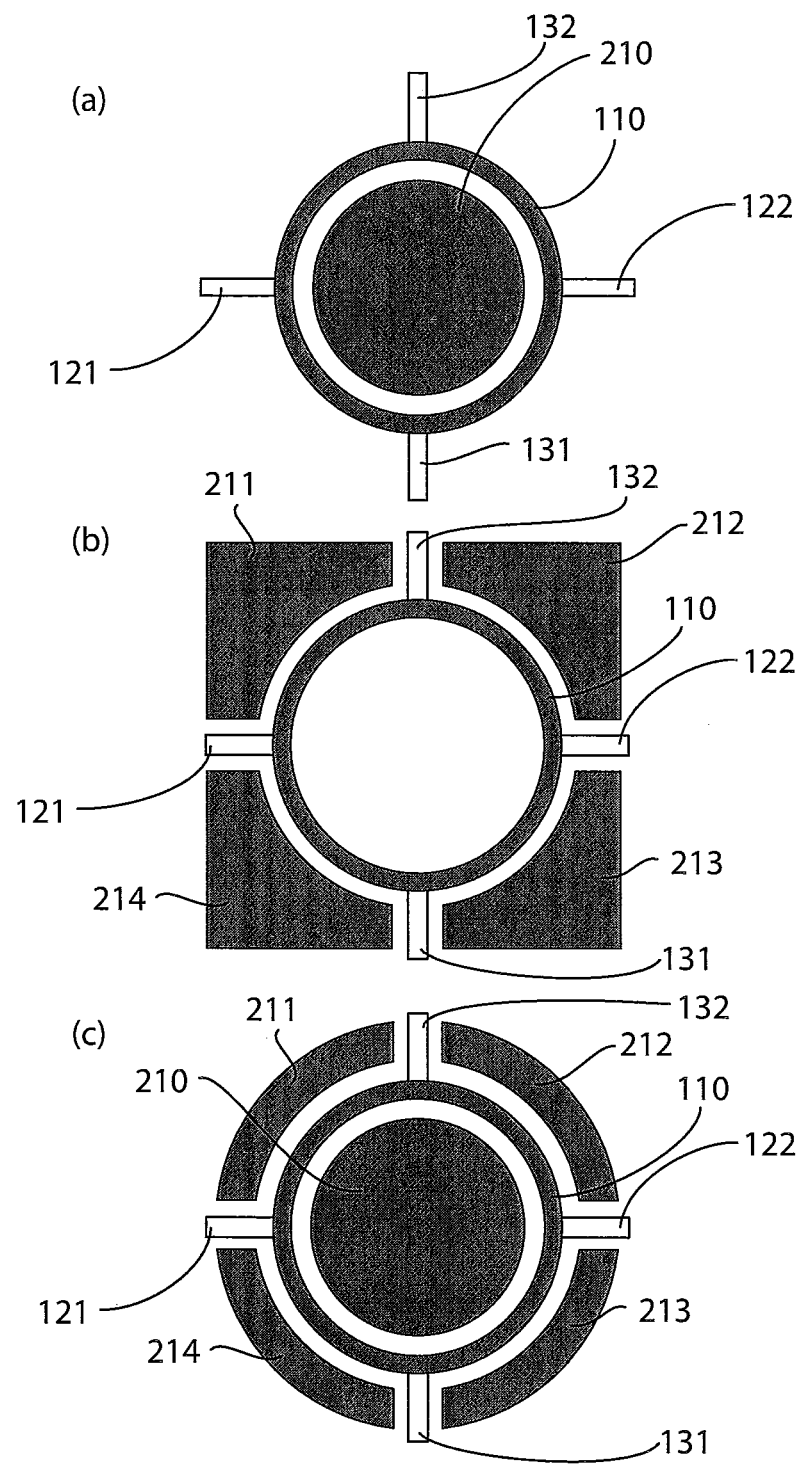
FIG. 11 shows the magnetic sensor according to another exemplary embodiment.
Figure 12:
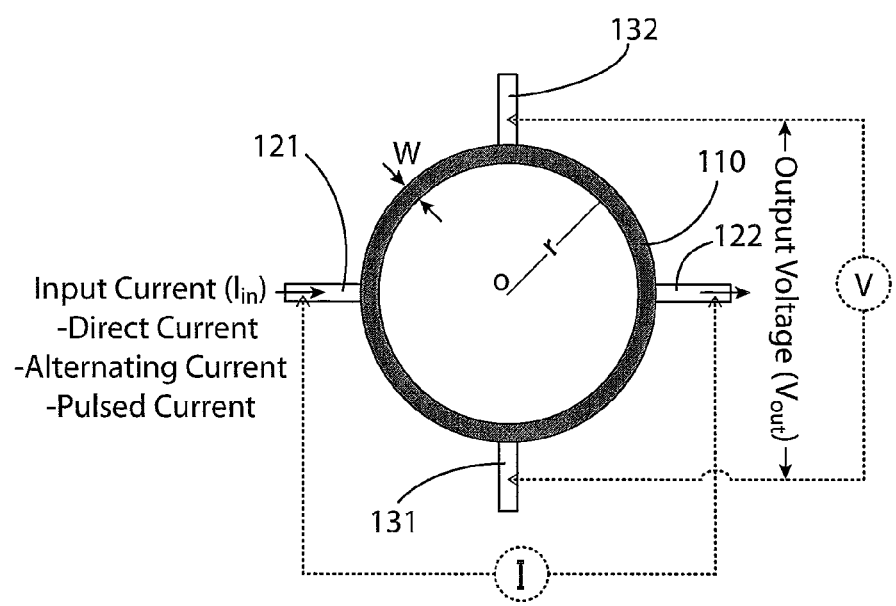
FIG. 12 shows an operation of the magnetic sensor according to an exemplary embodiment.

FIG. 10 shows the magnetic sensor according to an exemplary embodiment and FIG. 11 shows the magnetic sensor according to a preferred exemplary embodiment. FIG. 12 shows operations of the magnetic sensor according to an exemplary embodiment.

As shown in FIGS. 10 and 11, the magnetic sensor according to the present invention includes a closed loop shape magnetic layer 110, a pair of current terminals 121 and 122 for current input/output, a pair of voltage terminals 131 and 132 for measuring output voltage of the sensor and preferably includes internal or external magnetic layers 211 to 214 separated from the closed loop.

The magnetic layer of the closed loop has a closed loop shape that both ends of a band with a predetermined width of FIG. 12 are connected, and includes a circular closed loop of FIG. 10a, an oval closed loop of FIG. 10b or a polygonal closed loop of FIG. 10c.

As described above, preferably, the magnetic sensor according to the present invention includes the closed loop shape magnetic layer, the input/output terminals of the closed loop, the internal or external magnetic layer of the separated closed loop, a pair of current terminals and a pair of voltage terminals. Therefore, it has a characteristic that both the anisotropic magnetoresistance effect (AME) and planar Hall effect (PHE) of the magnetic layer 110 contribute to the output signal.

Preferably, the magnetic layer 110 is the circular closed loop as shown in FIG. 11. The magnetic sensor that has the shape of the circular closed loop provides an exchange coupling with a ferromagnetic layer which constitutes a magnetic layer 110 to eliminate the hysteresis of an output voltage, and has a superior linearity of the output voltage with the magnetic field. The magnetic sensor has a merit that it is possible to detect a magnetic field over a wide range from mT to pT by controlling the strength of an exchange coupling. Further, there is another merit that the magnetic layer 110 of the circular closed loop may easily form a pattern using a lithography thereby producing a nano or micro order sized sensor.

The magnetic sensor of the present invention will be described in detail based on the magnetic layer 110 of the circular closed loop as a preferable structure.

The circular closed loop shape magnetic layer 110 has a closed loop shape that both ends of a band with a radius R of FIG. 3 and a predetermined width W of FIG. 3 and has a characteristic that both the anisotropic magnetoresistance effect (AME) and the planar hall effect (PHE) contribute to the output signal of the sensor that a range of the R/W is over 0.5, actually it is 0.5 to 10,000. As the R/W increases, a shape anisotropy factor of a circumferential direction which comes from a shape of the magnetic layer increases and a magnetic domain, which cause a hysteresis of output voltage according to its movement. In this case, the magnetic layer whose material is the same as that of the closed loop may be placed inside (210) and/or outside (211 to 214) the closed loop separately from the closed loop (include a pair of voltage terminals and a pair of current terminals) in order to reduce the shape anisotropy factor by an interaction between a magnetic field induced from an internal or external magnetic layer separated from the closed loops and the magnetic layer of the closed loop, and eliminate formation of a magnetic domain of the closed loop, stabilize an output voltage, and finally enhance the hysteresis and the sensitivity characteristics.

It is preferable that a second magnetic layer 210 which is located inside the closed loop but separated from the closed loop with a predetermined distance has a centric structure with the closed loop 110. And a second magnetic layer 210 has a shape similar to that of the closed loop such as a circular, oval or polygonal shape.

It is preferable that each of third magnetic layers 211 to 214 formed outside the closed loop 110 separated with a predetermined distance from the pair of voltage terminals and the pair of current terminals has a symmetric structure in up-and-down and left-and-right. It is also preferable that the overall shape is a square of FIG. 11b or a circular one of FIG. 11c.

It is preferable to eliminate the formation of a magnetic domain by reducing the shape anisotropy factor, and to stabilize an output voltage by contributing to the output signal through rotation of magnetization. In order to enhance the hysteresis and the sensitivity, a separation distance between the magnetic layer 210 which is formed inside the closed loop and the closed loop, and between the magnetic layers 211 to 214 formed outside the closed loop and the closed loop, and between the pair of voltage terminals and the pair of current terminals may, preferably, be 20 nm to 0.5 mm.

As shown in FIG. 12, the magnetic sensor of the present invention includes the pair of current terminals 121 and 122 which input DC, AC or pulse current $I_{in}$ into the magnetic layer, a circular closed loop and provide a path for current flow, and a pair of voltage terminals 131 and 132 to measure DC, AC or a pulse output voltage $V_{out}$ which are output signals of a sensor in respond to changes of a magnetic field.

The pair of current terminals 121 and 122 is contact with the magnetic layer 110, the closed loop and two current terminals 121 and 122 may face each other, and the pair of voltage terminals 131 and 132 are contact with the magnetic layer 110, the closed loop and two voltage terminals 131 and 132 face each other.

As shown in detail in FIG. 12, when the current terminals 121 and 122 and the voltage terminals 131 and 132 are contact with the circumferential face of the closed loop 110, the AME and PHE characteristics of the magnetic layer which forms the closed loop are optimized thereby maximizing the output voltage. Preferably, the current terminals 121 and 122 or the voltage terminals 131 and 132 are not overlapped in upward and downward of the closed loop 110.

An extension line of the pair of current terminal facing each other 121 and 122 and an extension line of the pair of voltage terminals 131 and 132 facing each other cross in a right angle and, the current terminal 121-the voltage terminal 131-the facing current terminal 122-the facing voltage terminal 132 are alternated along side with the circumferential surface of the closed loop 110, and shows a characteristic that each terminal has an 90° angle toward the center O of FIG. 12 of the closed loop 110.

Then, as shown in FIG. 12, the current terminals 121 and 122 may be connected to a current source I and input current into the magnetic layer 110, and the voltage terminals 131 and 132 are connected to an external voltmeter V and outputs a potential difference between the two terminals.

As described above, one of ends of current terminals 121 and 122 and one of ends of voltage terminals 131 and 132 is contact with the magnetic layer 110 and the other end is connected to the current source I or the voltmeter V. Since the current terminals 121 and 122 and the voltage terminals 131 and 132 provide a low impedance path between external devices and the magnetic layer 110 in order to apply an external current without a loss and to output an output signal of a sensor without a loss, the current terminals 121 and 122 and the voltage terminals 131 and 132 may be formed with a normal metals.

In regards to minimizing a contact resistance and a surface resistance, the current terminals 121 and 122 and the voltage terminals 131 and 132 are preferably made with a non-magnetic metal material which has high electrical conductivity.

As described above, the magnetic sensor of the present invention has a characteristic of detecting a magnetic field using both the anisotropic magnetoresistance effect and planar hall effect of a magnetic layer. Accordingly, as shown in FIG. 12, it has also a characteristic of controlling a ratio between the radius (see r of FIG. 12) of the closed loop 110 and the width (see W of FIG. 12) of the closed loop 110 in order to control a comparative ratio between the voltage by the anisotropic magnetoresistance effect which contributes to the output signal of the sensor and the voltage by the planar hall effect.

As described in detail in FIG. 12, when the magnetic layer 110 has a large R/W, the output signal of the sensor may be mainly a voltage signal by an anisotropic magnetoresistance effect and the sensor may have a similar to that of a magnetoresistance sensor which uses only a resistance change with magnetic field. And as shown in FIG. 12, when the magnetic layer 110 has a small R/W, the output of the sensor mainly comes from a voltage by a planar Hall effect.

As expressed in detail with Equation 7, the output voltage $V_{out}$ of the magnetic sensor may be sum of voltage by the anisotropic magnetoresistance effect and voltage by the planar Hall effect. According to the present invention, in a structure of the circular closed loop magnetic layer 110 and a structure where each terminal has a 90° angle each other, the maximum voltage $\Delta V_{AME}$ depends on a resistance and varies according to R/W. However, the voltage $\Delta V_{PHE}$ by the planar Hall effect depends on the material characteristic of the magnetic layer 110 but does not depend on the size.

FIG. 5 shows output voltage in the functions of R/W in CoNi/MnIr bilayers, which confirm the output voltage performance based on the Equation 5. As described above, as the radius of the closed loop becomes smaller and the width of the closed loop becomes larger, the output voltage of the sensor is controlled more by the planar Hall effect. Also, as the radius of the closed loop becomes larger and the width of the closed loop becomes smaller, the output voltage of the sensor is controlled more by the anisotropic magnetoresistance effect. In the R/W range between a region where the planar Hall effect is a major factor and a region where the anisotropic magnetoresistance effect is a major factor, the sensor output is controlled by both the planar Hall effect and the anisotropic magnetoresistance effect.

As described above, the magnetic sensor of the present invention, in the same structure, by simply controlling the R/W, may act as 3 kinds of sensors, such as a sensor in which an anisotropic magnetoresistance effect plays a key role, a sensor in which both an anisotropic magnetoresistance and a planar Hall effects play a key role, and a sensor in which a planar Hall effect plays a key role.

The R/W, the material and multilayer structure of the magnetic layer and the radius R of the closed loop may be decided in consideration of application fields such as a magnetic field sensor, a bio-sensor, an angle sensor and an eddy current detection sensor based on the present invention. In this case, the radius R of the closed loop may be nano meter order to millimeter order but the magnetic sensor of the present invention may not be limited by its size.

In magnetic sensor of the present invention using both the AME and PHE, the magnetic layer may use multilayer structures including a ferromagnetic layer, an ant-ferromagnetic layer and nonmagnetic metal layers.

In detail, the magnetic layer which is formed in the magnetic sensor of the present invention includes a ferromagnetic film, and a laminated multilayer film that one or more films selected from an antiferromagnetic film, an insulator film, a non-magnetic metal film are laminated on the ferromagnetic film. It is also a magnetic layer that may obtain an output signal which has a low peak and a high peak when a magnetic field is sweep from negative to positive field.

For an instance, the magnetic layer is a multilayer film that includes one or more of a multilayer film structure of an ferromagnet/antiferromagnet, a multilayer film structure of a ferromagnet/metal/antiferromagnet, a multi-layer film structure of a ferromagnet/metal/ferromagnet, a multi-layer film structure of a ferromagnet I/insulator/ferromagnet II or a multi-layer film structure of a ferromagnet I/metal/ferromagnet II/antiferromagnet. These magnetic layers do not show a hysteresis of the output voltage.

Considering the magnetic sensor of the present invention, it is preferable that the basic structure of magnetic layer 110 is the ferromagnet/antiferromagnet bilayers or ferromagnet// metal/antiferromagnet trilayers that has a strong exchange coupling or a week exchange coupling, respectively, in order to easily control the sensitivity and measuring range of the magnetic field. In this case, the range of the magnetic field may be also controlled by changing the thickness of the ferromagnetic layer based on the exchange bias field in Equation 10.

The ferromagnetic film is preferably an alloy of one or more materials selected from Ni, Fe and Co, and more preferably an alloy of NiFe or NiCo which shows larger magnetoresistivity $\Delta\rho \propto \gamma(\alpha-1)$, which is proportional to an effect of spin-orbit scattering $\gamma$ and a spin polarization $\alpha$. Accordingly, it is possible to use a material which has a large spin polarization as a ferromagnetic film, and also it is preferable to use a half-metal whose polarization ratio is 100% ($\alpha=0$). Also, as the magnetoresistance $\Delta R$ is proportional to the resistivity $\rho_0$, of a material and the magnetoresistivity ratio $\Delta\rho=\rho_0 \cdot MR$ (%), it is preferable to use an oxide magnetic material whose resistivity is large such as the colossal magnetoresistance materials.

The exchange bias field is induced by the antiferromagnetic film at the interface between ferromagnetic film and the antiferromagnetic film. Materials of Mn-alloy which have a strong exchange coupling effect are being used for a material of an antiferromagnetic film Mn-alloy antiferromagnetic materials may be, preferably IrMn in respect to a thermal stability and a low temperature process. And a transition metal oxide such as NiO or $Fe_3O_4$ which is an insulator while having antiferromagnetic properties may be used for enhancing an output signal.

In this case, the multi-layer film may include more than one under layer in order to promote a coupling with a substrate and to enhance the crystal structure of the ferromagnetic layer. For an instance, it is preferable to use a Ta, Cu, Ru etc as the under layer in case of the ferromagnetic NiFe film and the antiferromagnetic IrMn film.

In this case, the magnetic layer 110, the pair of current terminals 121 and 122 and the pair of voltages 131 and 132 may be formed on a non-conductive substrate for the physical support, and the non-conductive substrate includes glass, Si, $SiO_2$, SiN or multilayer substrate made with those materials.

The magnetic layer 110 may be fabricated by using a sputtering system, a molecular beam evaporation (MBE), a metal organic chemical vapor deposition (MOCVD) or an electric coating, and the closed loop, the terminals 121, 122, 131 and 132 and the internal and external magnetic layers 210 and 211 to 214 may be patterned through a lithography method using a mask.

A photograph of the closed loop inserted in FIG. 3 shows a magnetic sensor according to an exemplary embodiment, taken by a scanning electron microscope, and Si/SiO is used for the substrate material. In addition, a magnetic layer having a multilayer structure of Ta 3 nm/NiFe 50 nm/IrMn 10 nm/Ta 3 nm is patterned in a shape of a circular closed loop with a radius R=150 μm and a size of W=10 μm. The terminals 121, 122, 131 and 132 are made of gold (Au).

For an instance of a comparison, the anisotropic magnetoresistance sensor (see AME sensor of FIG. 4) and the planar Hall effect sensor (see PHE sensor of FIG. 4) are made similarly to the magnetic sensor according to the present invention (see AME+PHE sensor of FIG. 4) in a shape of a circular closed loop.

FIG. 4 shows a result of output voltage $V_{out}$ of the magnetic sensor, the AME sensor and the PHE sensor with magnetic field under the constant input current of $I_{in}$=1 mA. As shown in the FIG. 4, the output value of the magnetic sensor of the present invention is larger than that of the AME sensor or the PHE sensor, and it shows the output voltage of magnetic sensor includes the output values of the AME and PHE sensors.

Also, it is known that the hysteresis does not appear during the sweep of magnetic field and the linearity of an output voltage near H=0 is superior. It means that a magnetic field is detected with an ultra high sensitivity using the magnetic sensor.

FIG. 3 shows the output voltage of the magnetic sensor made according to the present invention and a calculated one for a magnetic sensor that has a circular closed loop and a 90° angle among terminals. The calculated output signal is based on the Stoner-Wolfforth model for the magnetization behavior with magnetic field and the Wheatstone bridge circuit for the output signal characteristics. As shown in FIG. 3, the calculated and the measured values well match each other. Therefore, the magnetic sensor of the present invention has characteristics of both AME and PHE and shows a superior linearity and has a merit to control the sensitivity by tuning the exchange bias field.

Applications of the Magnetic Sensor

The magnetic sensors according to the present invention may be used for a micro sized 3-axis magnetic field sensor by aligning in 3 axis of x, y and z. Two magnetic sensors may be placed on an x-y plane in order to measure the magnetic field of an x-y axis. When used for a 3 axis magnetic field sensor to measure a magnetic field of a z-axis direction which is perpendicular to the x-y plane by using a Hall effect of a semiconductor, the size of the 3 axis magnetic sensor may be minimized. Therefore, there is a merit to apply the magnetic sensor to electronic instruments such as mobile phones and apparatus which require a sensor of a micro/ultra low power 3-axis magnetic field.

As the magnetic sensor according to the present invention is micro sized, it may be used as a bio-sensor that measures a nano or micro order sized magnetic bead. In general, as a magnetic bead uses a super paramagnetic material, the stray magnetic field increases with external magnetic field. Accordingly, stray field of a magnetic bead is measured by using the micro-sized magnetic sensor according to the present invention. In this case, extracting an influence by only the stray magnetic field may be limited because a signal from the external magnetic field and a signal from the stray magnetic field are mixed together to be measured.

Accordingly, there is a merit to enhance the extracting of the magnetic bead only signal by using the internal magnetic field induced by a drive current of the magnetic sensor according to the present invention. It means that DC or AC drive current that flows in the closed loop may generate a DC magnetic field or AC magnetic field surrounding the closed loop and the magnetic field may magnetize a magnetic bead near the closed loop, thereby forming the DC or AC stray magnetic field. In this case, the strength of the drive current may provide an effect not only to enhance the stray magnetic field but also enhance a signal characteristic of the magnetic sensor. Accordingly, there exists a merit that a bio-sensor to detect a stray magnetic field of a micro bead may be realized since only the drive current is used without applying an external magnetic field.

The magnetic sensor according to the present invention makes it possible to measure the permeability according to a magnetic film or a magnetic material surrounding the closed loop by use of the internal magnetic field generated by an AC drive current. As a magnetic sensor according to the present invention uses the a magnetoresistance characteristic, the measurable frequency (f) range is available from DC f=0 to a ferromagnetic resonance frequency f=GHz, so it has a merit to make it possible to use a wideband permeability sensor whose low frequency characteristic is superior to that of a permeability sensor which uses a coil.

Since the magnetic sensor according to the present invention may be micro-miniaturized and has a superior low frequency characteristic, it has an effect to overcome a size of detectable defects and a limitation of a low frequency of the existing coil sensor that is used as an eddy current sensor in non destructive inspection. Accordingly, it has a merit to realize an eddy current sensor for non destructive inspection such as detecting a micro order sized defect inside metallic thick films like a gas pipe lines.

Since the magnetic sensor according to the present invention has a superior sensitivity, the magnetic sensor may be used as NMR sensor for measuring a resonance signal of a low field nuclear magnetic resonance (NMR) system. As an existing high magnetic field (H~T order) NMR system use coil sensor as a NMR sensor in order to detect the 100 MHz order of nuclear magnetic resonance frequency. While the ultra low field (H=µT order) NMR system uses AC-SQUID as a NMR sensor for detect a low frequency and has a small NMR signal. The AC SQUID has a resolution of fT. Accordingly, in the NMR system of the low magnetic field (µT<H<T), it is possible to use the magnetic sensor according to the present invention for detecting the several MHz order of nuclear magnetic resonance frequency within a sub-nT range.

The magnetic sensor according to the present invention makes it possible to enhance the magnetic bead detection performance by using an array type bio-sensor or imaging sensor. The array sensors have a merit to be used as a two dimensional (2D) or three dimensional (3D) magnetic field imaging sensor.

The magnetic sensor according to the present invention may sensitively detect the ultra low magnetic field by using both characteristics of the anisotropic magnetoresistance effect (AME) and the planar Hall effect (PHE) which depend on the applied magnetic field.

Also, as the magnetic sensor has a simple structure formed of a magnetic layer of a closed loop shape and 4 terminals, it is easily manufactured and mass production is possible. It may be manufactured in a micro size as the minute closed loop pattern may be adopted by using lithography techniques. The magnetic layer is fabricated by using the film deposition technique which is normally used in a semiconductor process, and it has a strong point of easy integration with other elements or circuits by using the resistance characteristic.

Also, in the magnetic layer of the closed loop shape, though the shape anisotropy field to the direction of circumference increases as the ratio R/W of the radius [R] of the loop and the width [W] of the loop of the closed loop increases, which increases hysteresis and decreases sensitivity. These effects which are due to shape anisotropy of the closed loop are improved by placing the same magnetic layer inside or outside the closed loop when patterning the shape of the closed loop. The magnetic layer inside or outside the closed loop play the role of the shape anisotropy compensator (SAC) which stabilizes the magnetization loop through interaction of the magnetic field induced from inside or outside the magnetic layers and the magnetic layer of the closed loop.

For the magnetic sensor of the circular closed loop shape, symmetry of the closed loop may be easily maintained. When a magnetic sensor is patterned by photolithography, the asymmetric shape may be minimized because it is of rounded and symmetric structure. Accordingly, it has a strong point of minimizing the offset which is a parasitic voltage of the output signal resulting from the asymmetric shape generated during pattering of magnetic sensor.

Though the magnetic sensor is in principle driven by a constant current as it detects change in the magnetoresistance of the magnetic layer, it also may be driven by a constant voltage. In case R/W of the circular closed loop is small, the resistance of the magnetic sensor decreases and planar Hall effect becomes predominant, and the output voltage of such planar Hall effect is proportional to the driving current. Accordingly, in case the R/W of the circular closed loop is small, constant current driving is advantageous. On the other hand, when the R/W of the circular closed loop is large, the resistance of the magnetic sensor increases and anisotropic magnetoresistance effect becomes predominant. Also, the output voltage of the anisotropic magnetoresistance effect is proportional to the driving voltage. Accordingly, when the R/W of the circular closed loop is large, the constant voltage driving is advantageous. When these constant voltage or constant current are driven by the pulse type signal, it has a strong point that an ultra low-power magnetic sensor may be realized.

While the present invention has been described with respect to specific matters such as detailed constituent elements, certain preferred embodiments and drawings, it will be apparent that the present invention is not limited to the above embodiments and various changes and modifications may be made from the description by those skilled in the art.

Thus, the idea of the invention should not be construed to be restricted to the Examples, but any equivalency or equivalent modifications of claims, as well as claims themselves described here-in-below are intended to fall under the scope of the idea of the invention.

What is claimed is:

1. A magnetic sensor, comprising:
   a first magnetic layer in a shape of a closed loop;
   a pair of current terminals which face each other contacting with the first magnetic layer and through which current is input and output;
   a pair of voltage terminals which face each other contacting with the first magnetic layer and from which output voltage is detected; and
   a second magnetic layer disposed inside the closed loop, wherein the second magnetic layer is made of a same material as the first magnetic layer, wherein the second magnetic layer is separated from the first magnetic layer, the current terminals, and the voltage terminals, and wherein the second magnetic layer is concentric with the first magnetic layer and is spaced by a predetermined distance from the first magnetic layer.

2. The magnetic sensor of claim 1, wherein the output voltage from the pair of voltage terminals has a characteristic of anisotropic magnetoresistance effect (AME) and planar Hall effect (PHE) of the first magnetic layer.

3. The magnetic sensor of claim 2, wherein the closed loop is a circular closed loop, an oval closed loop or a polygonal closed loop.

4. The magnetic sensor of claim 2, wherein the closed loop is a circular closed loop.

5. The magnetic sensor of claim 4, wherein the loop has an inner, median, and outer radius, and wherein a ratio between the median radius and a difference between the outer radius and the inner radius is 0.5 or larger.

6. The magnetic sensor of claim 1, wherein a terminal selected from the pair of current terminals and a terminal selected from the pair of voltage terminals have a 90° angle therebetween.

7. The magnetic sensor of claim 1, wherein the input current is direct current (DC), alternating current (AC) or a pulse.

8. The magnetic sensor of claim 2, wherein the first magnetic layer includes a ferromagnetic film.

9. The magnetic sensor of claim 8, wherein the first magnetic layer further includes one or more films selected from the group consisting of an antiferromagnetic film, an insulator film and a non-magnetic metal film.

10. The magnetic sensor of claim 1, wherein the first magnetic layer is selected from the group consisting of:
   a film including a ferromagnetic film and an antiferromagnetic film;
   a film including a ferromagnetic film, a metal film and an antiferromagnetic film;
   a film including a ferromagnetic film (I), an insulator film and an antiferromagnetic film (II); and
   a film including a ferromagnetic film (I), a metal film, a ferromagnetic film (II) and antiferromagnetic film.

11. The magnetic sensor of claim 1, further comprising a third magnetic layer that is made of the same material as the first magnetic layer and is separated by a predetermined distance from the first magnetic layer, each of the current terminals and each of the voltage terminals.

12. A magnetic sensor comprising:
   a first magnetic layer in a shape of a closed loop;
   a pair of current terminals which face each other contacting with the first magnetic layer and through which current is input or output;
   a pair of voltage terminals which face each other contacting with the first magnetic layer and from which output voltage is detected; and
   a second magnetic layer disposed outside the closed loop, wherein the second magnetic layer is made of a same material as the first magnetic layer, wherein the second magnetic layer is separated from the first magnetic layer, the current terminals, and the voltage terminals, and wherein the second magnetic layer is spaced by a predetermined distance from the first magnetic layer.

13. The magnetic sensor of claim 1, wherein the second magnetic layer has a solid circular shape.

* * * * *